US00RE39693E

(19) United States
(12) Reissued Patent
Pupalaikis

(10) Patent Number: US RE39,693 E
(45) Date of Reissued Patent: Jun. 12, 2007

(54) DIGITAL FREQUENCY RESPONSE COMPENSATOR AND ARBITRARY RESPONSE GENERATOR SYSTEM

(75) Inventor: Peter J. Pupalaikis, Ramsey, NJ (US)

(73) Assignee: LeCroy Corporation, Chestnut Ridge, NY (US)

(21) Appl. No.: 11/364,796

(22) Filed: Feb. 28, 2006

Related U.S. Patent Documents

Reissue of:
(64) Patent No.: 6,701,335
Issued: Mar. 2, 2004
Appl. No.: 10/090,051
Filed: Feb. 27, 2002

(51) Int. Cl.
*G06F 17/10* (2006.01)

(52) U.S. Cl. ..... 708/300

(58) Field of Classification Search ..... None
See application file for complete search history.

(56) References Cited

U.S. PATENT DOCUMENTS

| | | | | |
|---|---|---|---|---|
| 4,788,653 A | | 11/1988 | Henderson et al. | |
| 4,875,166 A | | 10/1989 | Carroll et al. | |
| 5,226,059 A | | 7/1993 | Fasterling | |
| 5,239,578 A | | 8/1993 | Regen et al. | |
| 5,280,353 A | | 1/1994 | Baldwin | |
| 5,283,483 A | | 2/1994 | Laber et al. | |
| 5,341,177 A | * | 8/1994 | Roy et al. | 348/614 |
| 5,388,062 A | | 2/1995 | Knutson | |
| 5,487,023 A | | 1/1996 | Seckora | |

(Continued)

FOREIGN PATENT DOCUMENTS

| | | |
|---|---|---|
| JP | 10-282153 | 10/1998 |
| WO | WO 00/38384 | 6/2000 |

OTHER PUBLICATIONS

A versatile real–time deconvolution DSP system implemented using a time domain inverse filter. P. Gaydecki, Measurement Science & Technology, vol. 12, nl, p82–8, Jan. 2001.

Vector signal analyzers for difficult measurements on time–varying and complex modulated signals. (HP's 894xxA signal analyzers) (technical), K.J. Blue et al., Hewlett–Packard Journal, v44, n6, p. 6(11), Dec. 1993.

Design considerations in the microwave transition analyzer, (HP 71500A) (Technical), M. Dethlefsen et al., Hewlett–Packard Journal, v43, n5, p. 63(9), Oct. 1992.

Accuracy in interleaved ADC systems, (Analog–to–digital conversion in the HP 54720 series oscilloscopes and HP 54722A and HP 54721A plug–in modules) (includes related articles on bit limits on resolution and dithering, and on designing filters for interpolation) (technical), A. Montigo et al., Hewlett Packard Journal, v44, n5, p. 38(9), Oct. 1993.

A multirate bank of digital bandpass filters for acoustic application. (Design of HP's 3569A real–time frequency analyzer), J.W. Waite, Hewlett–Packard Journal, v44, n2, p. 73(9), Apr. 1993.

(Continued)

*Primary Examiner*—D. H. Malzahr
(74) *Attorney, Agent, or Firm*—Frommer Lawrence & Haug LLP; William S. Frommer

(57) ABSTRACT

A digital signal processing system capable of compensating for frequency response variations and generating a response characteristic that complies with a provided specification. The system automatically generates digital filters to provide this compensation with almost any form of channel frequency response information and with user defined specifications. The capability of this system to trade-off noise performance, pulse response, and frequency response flatness in order to provide an optimized response is demonstrated. The system also provides feedback to the user on the final response characteristics.

91 Claims, 20 Drawing Sheets

(Amended)

U.S. PATENT DOCUMENTS

| | | | | |
|---|---|---|---|---|
| 5,574,639 | A | | 11/1996 | Qian et al. |
| 5,577,117 | A | * | 11/1996 | Rabipour et al. ..... 379/414 |
| 5,698,984 | A | | 12/1997 | Little et al. |
| 5,754,437 | A | | 5/1998 | Blazo |
| 5,812,009 | A | | 9/1998 | Matsuura |
| 5,854,756 | A | | 12/1998 | Willink |
| 5,978,742 | A | | 11/1999 | Pickerd |
| 6,175,849 | B1 | | 1/2001 | Smith |
| 6,184,748 | B1 | | 2/2001 | Rao et al. |
| 6,219,392 | B1 | | 4/2001 | Abe |
| 6,279,021 | B1 | | 8/2001 | Takano et al. |
| 6,304,134 | B1 | | 10/2001 | Pavan |
| 6,437,932 | B1 | | 8/2002 | Prater et al. |
| 6,539,318 | B2 | | 3/2003 | Miller et al. |
| 6,542,914 | B1 | | 4/2003 | Pupalaikis |
| 6,581,080 | B1 | | 6/2003 | Richards |
| 6,631,175 | B2 | | 10/2003 | Harikumar et al. |
| 2002/0075267 | A1 | | 6/2002 | Cake et al. |
| 2002/0109496 | A1 | | 8/2002 | Miller et al. |
| 2002/0163959 | A1 | | 11/2002 | Haddad |
| 2002/0171408 | A1 | | 11/2002 | Hansen |
| 2003/0002574 | A1 | | 1/2003 | Yang et al. |
| 2003/0007583 | A1 | | 1/2003 | Hilton et al. |
| 2003/0055855 | A1 | | 3/2003 | Wiener |
| 2003/0118094 | A1 | | 6/2003 | Wang et al. |
| 2005/0080831 | A1 | | 4/2005 | Pickerd et al. |

OTHER PUBLICATIONS

A 10–Hz–to–150–MHz spectrum analyzer with a digital IF section. (Includes related article on adaptive data acquisition), K.C. Carlson et al., Hewlett–Packard Journal, v42, n3, p. 44(16), Jun. 1991.

Use DSP filter concepts in IF system design, (digital signal processing, intermediate frequency) (includes related article), Chester et al., Electronic Design, v42, n14, p. 80(7), Jul. 11, 1994.

Focus on software that relieves DSP headaches. (digital signal processing), Leonard, Milt, Electronic Design, v35, n25, p. 113(5), Oct. 29, 1987.

A standard data format for instrument data interchange. (HP's DSF standard for analyzers) (technical), M.L. Hall, Hewlett–Packard Journal, v44, n6, p. 85(5), Dec. 1993.

Optimum FIR Digital Filter Implementations for Decimation, Interpolation, and Narrow–Band Filtering, Ronald E. Crochiere and Lawarence R. Rabiner, IEEE Transactions On Acoustics, Speech, and Signal Processing, vol. ASSP–23, No. 5, Oct. 1975.

"Digital Signal Processing; Principles, Algorithms and Applications", John G. Proakis et al., Prentice Hall, 1996, pp. 519–539.

"Microwave Transition Analyzer: A New Instrument Architecture for Component and Signal Analysis"; David J. Ballo et al., Hewlett–Packard Journal, Oct. 1992; pp. 48–71.

"Advantages and Disadvantages of Using DSP Filtering on Oscilloscope Waveforms"; Agilent Technologies, Inc., May 24, 2004; pp. 1–14.

"DSP in High Performance Oscilloscopes"; John J. Pickerd, Tektronix, Inc., Mar. 2004; pp. 1–20.

"Understanding Digital Signal Processing"; Richard G. Lyons, Prentice Hall, Professional Technical Reference, First Edition 1997 (Second Edition Mar. 2004); pp. 30–39; 346–360; 471–479; and 571–571.

"Electronics Engineers' Handbook"; Donald G. Fink et al.; McGraw Hill Book Company, First Edition 1975; pp. 46–55.

"HP 71500A Microwave Transition Analyzer", Hewlett–Packard Company, Aug. 1997.

Quick Start Guide "HP 71500A and HP 70820A, Microwave Transition Analyzer", Hewlett–Packard, HP Part No. 70820–90047, Edition B.0.0, Nov. 1992.

A 70mW 7th Order Filter with 7 to 50MHz Cutoff Frequency, Programmable Boost, and Group–Delay Equalization; F. Rezzi; IEEE International Solid State Circuits Conference; 1997; pp. 1–3.

"Adaptive Signal Processing"; Bernard Widrow et al.; Prentice–Hall Signal Processing Series; 1985; pp. 1–23; 212–225.

"DSP Improves Control of SMPS"; Colin Holland; Embedded.com; Oct. 14, 2002; pp. 1–8.

"Gain Compression—bode Plots & Nichols Charts"; ECE 402 Controls Lab #5 Nov. 30, 2001, pp. 1–8.

"Tunable Digital Frequency Response Equalization Filters", P. Regalia et al.; IEEE Transactions on Acoustics, Speech, and Signal Processing, vol. ASSP–35, No. 1, Jan. 1987; pp. 118–120.

"Telecom Mask Testers"; LeCroy Corporation; Jan. 1999, pp. 1–8.

LeCroy User Guide OE325; Dec. 1998; pp. 1–6.

"Signal Analyzers, Microwave Transition Analyzer"; HP 71500A; pp. 31–34.

* cited by examiner

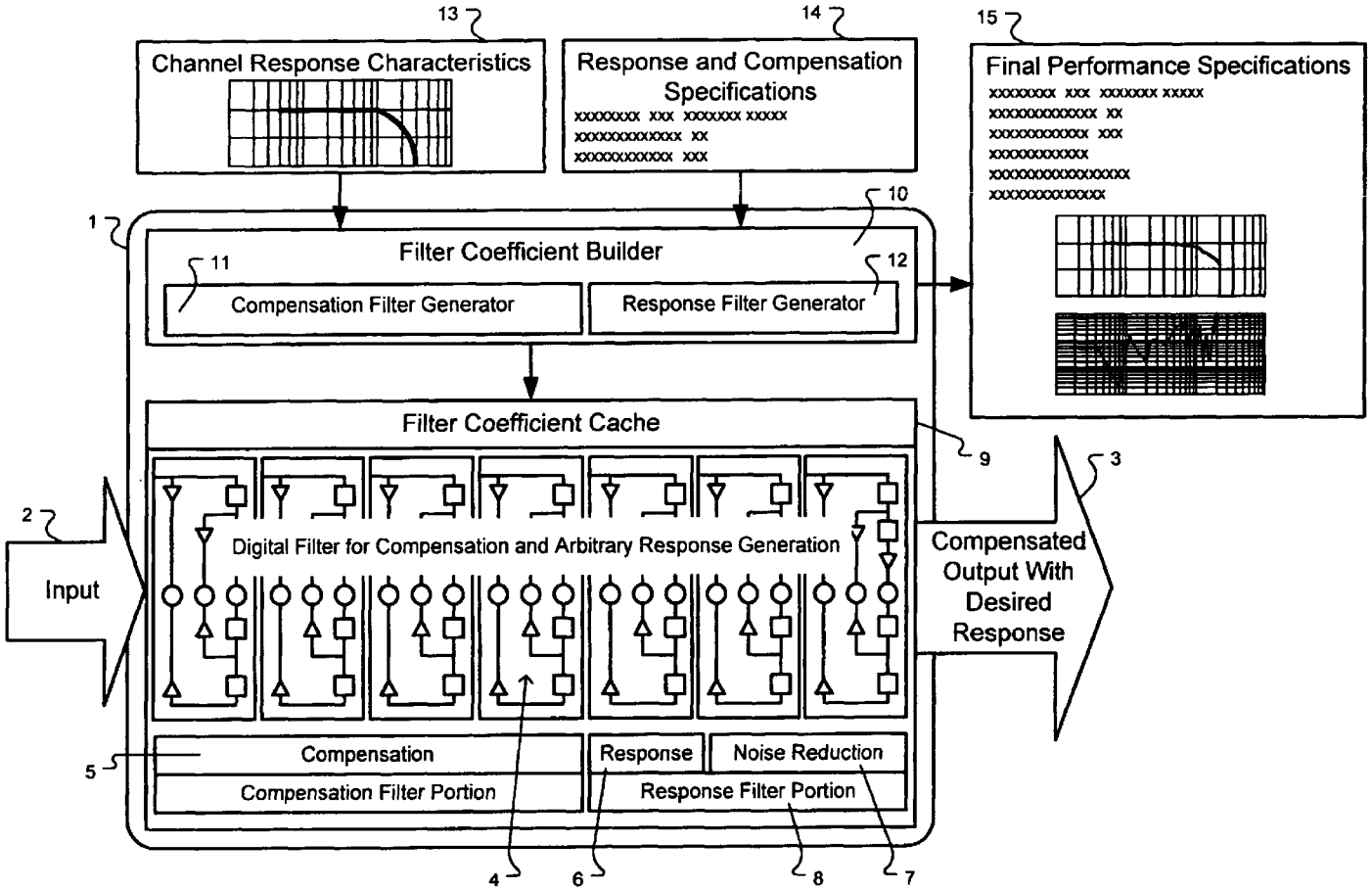
Figure 1
(Amended)

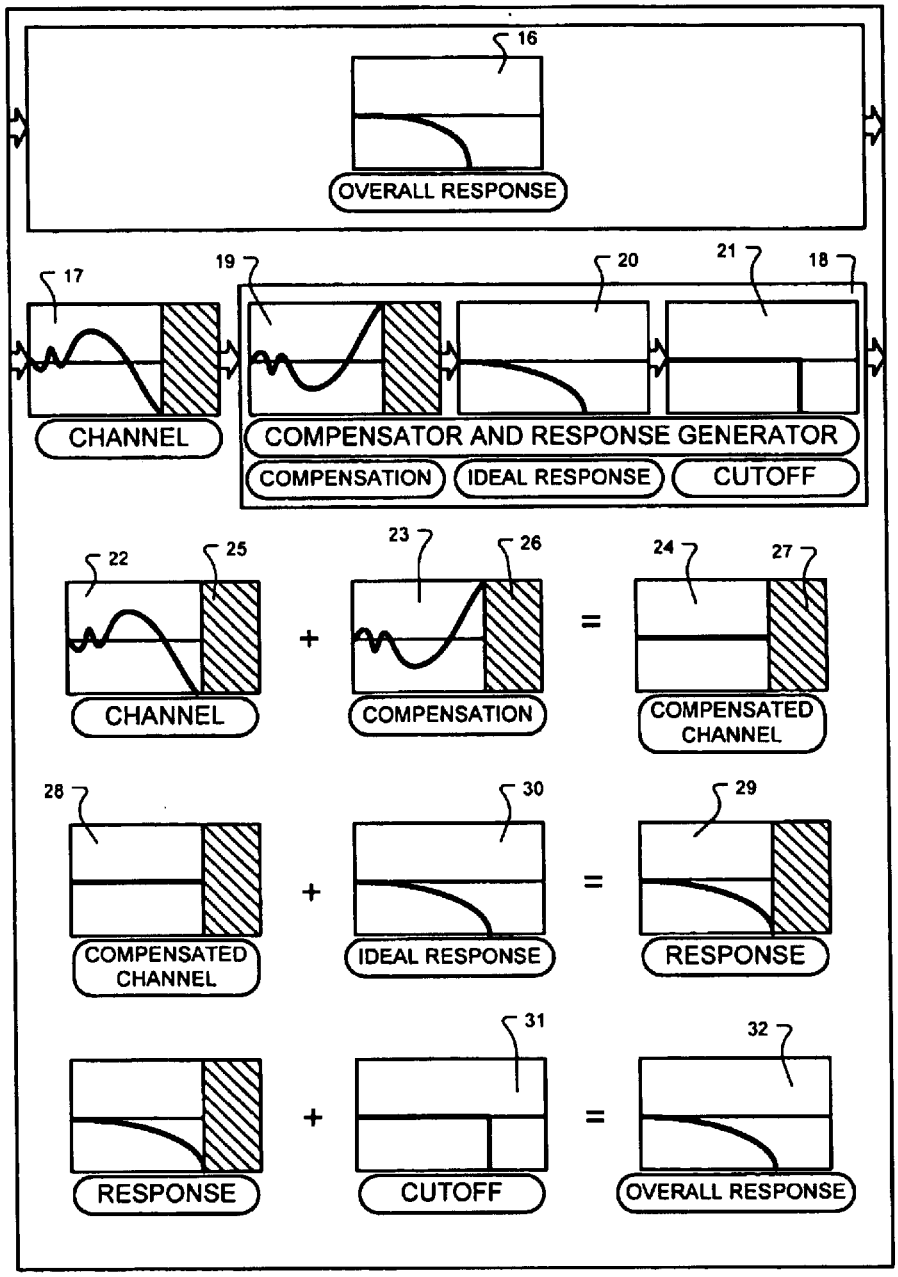
Figure 2
(Amended)

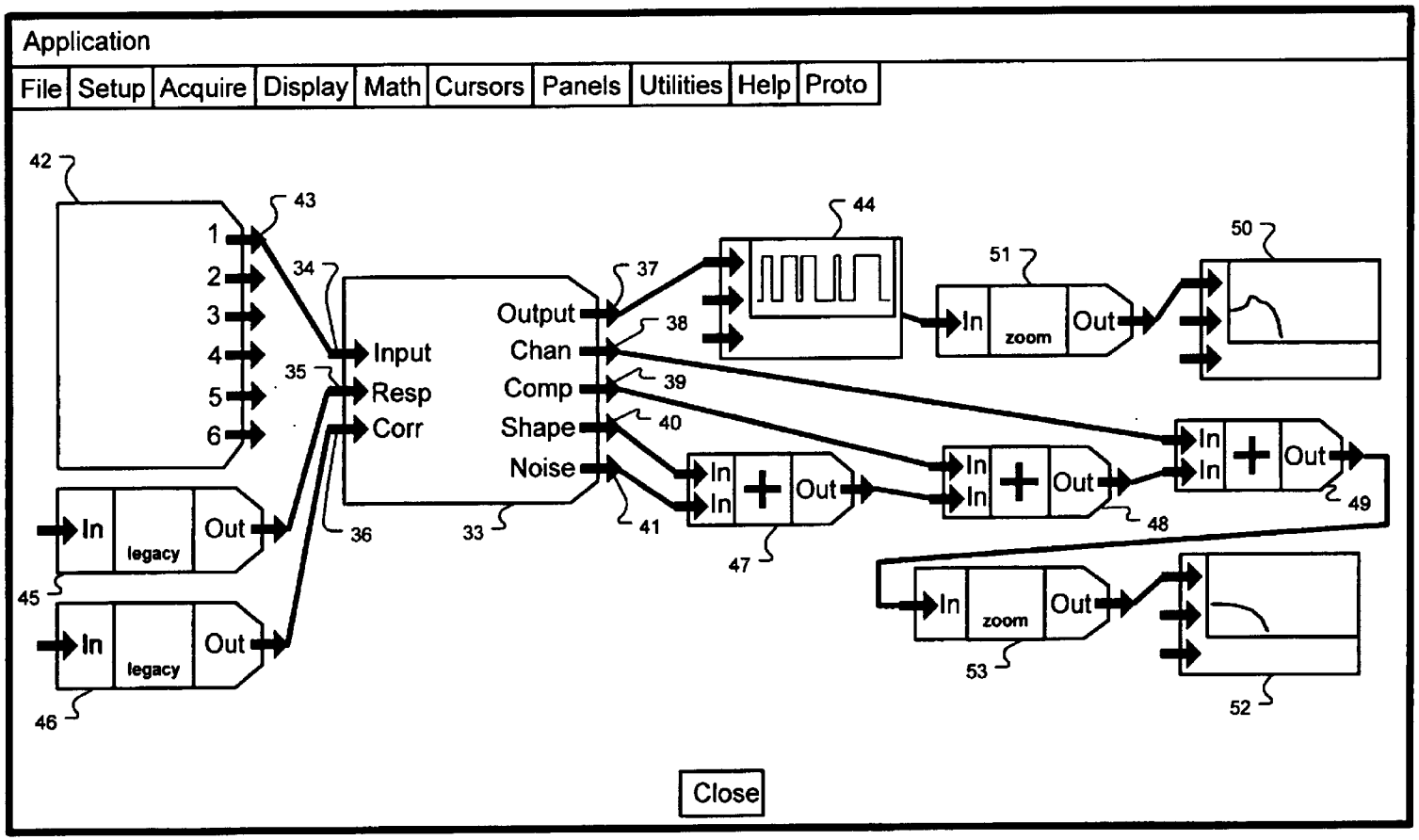
Figure 3
(Amended)

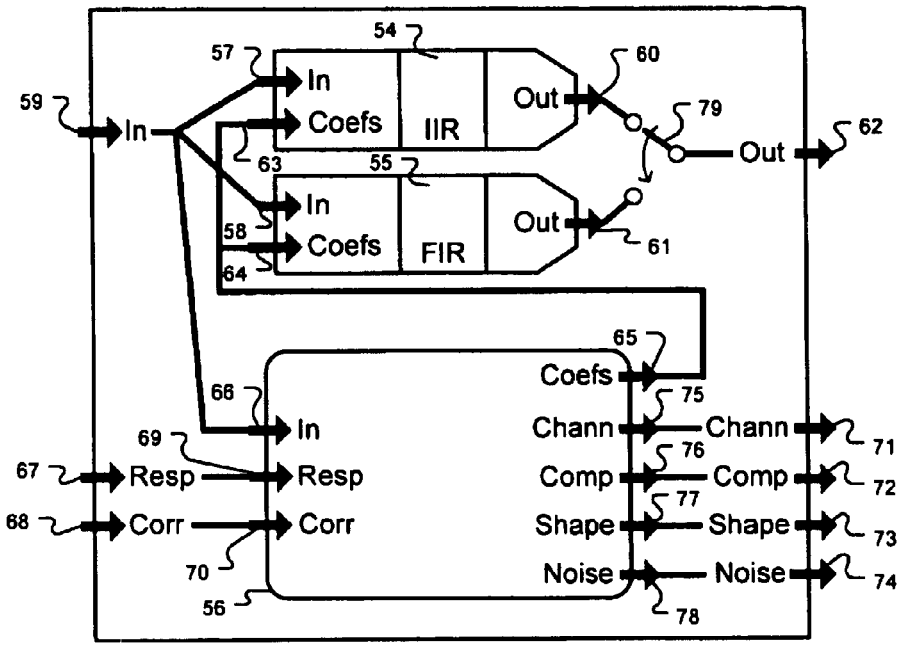
Figure 4
(Amended)

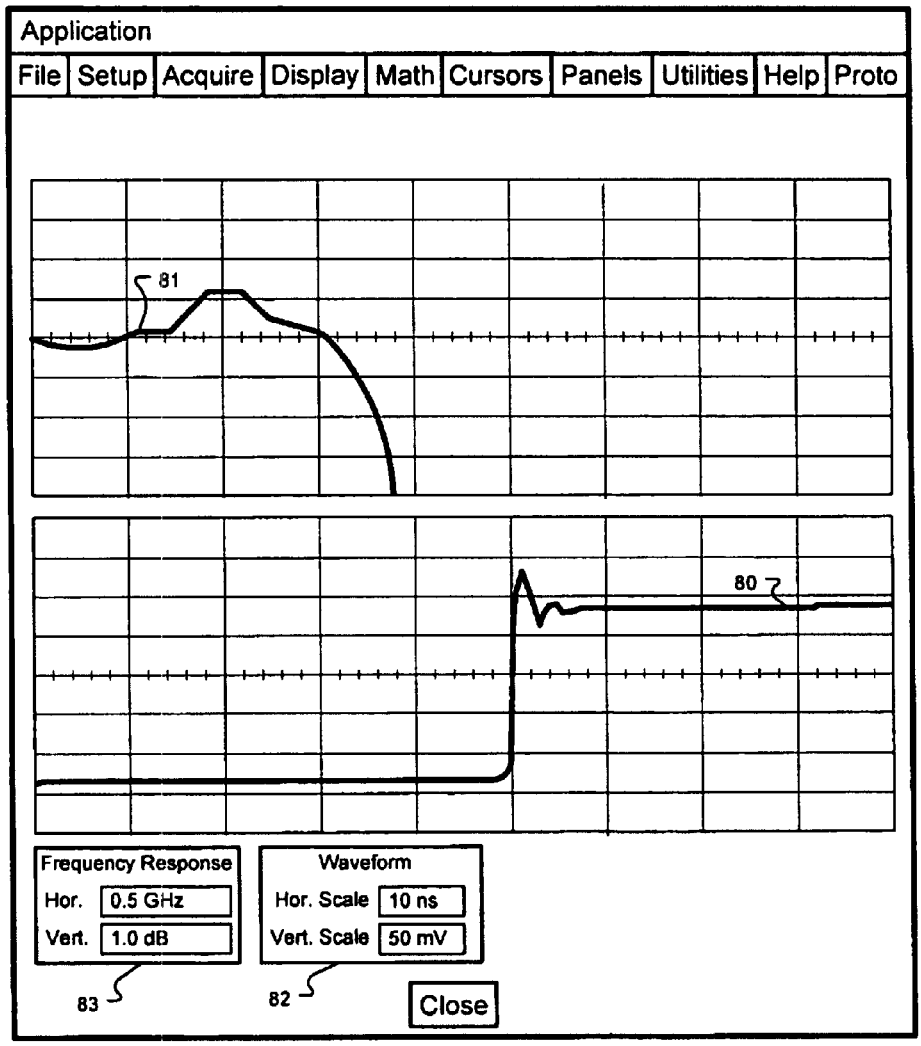
Figure 5
(Amended)

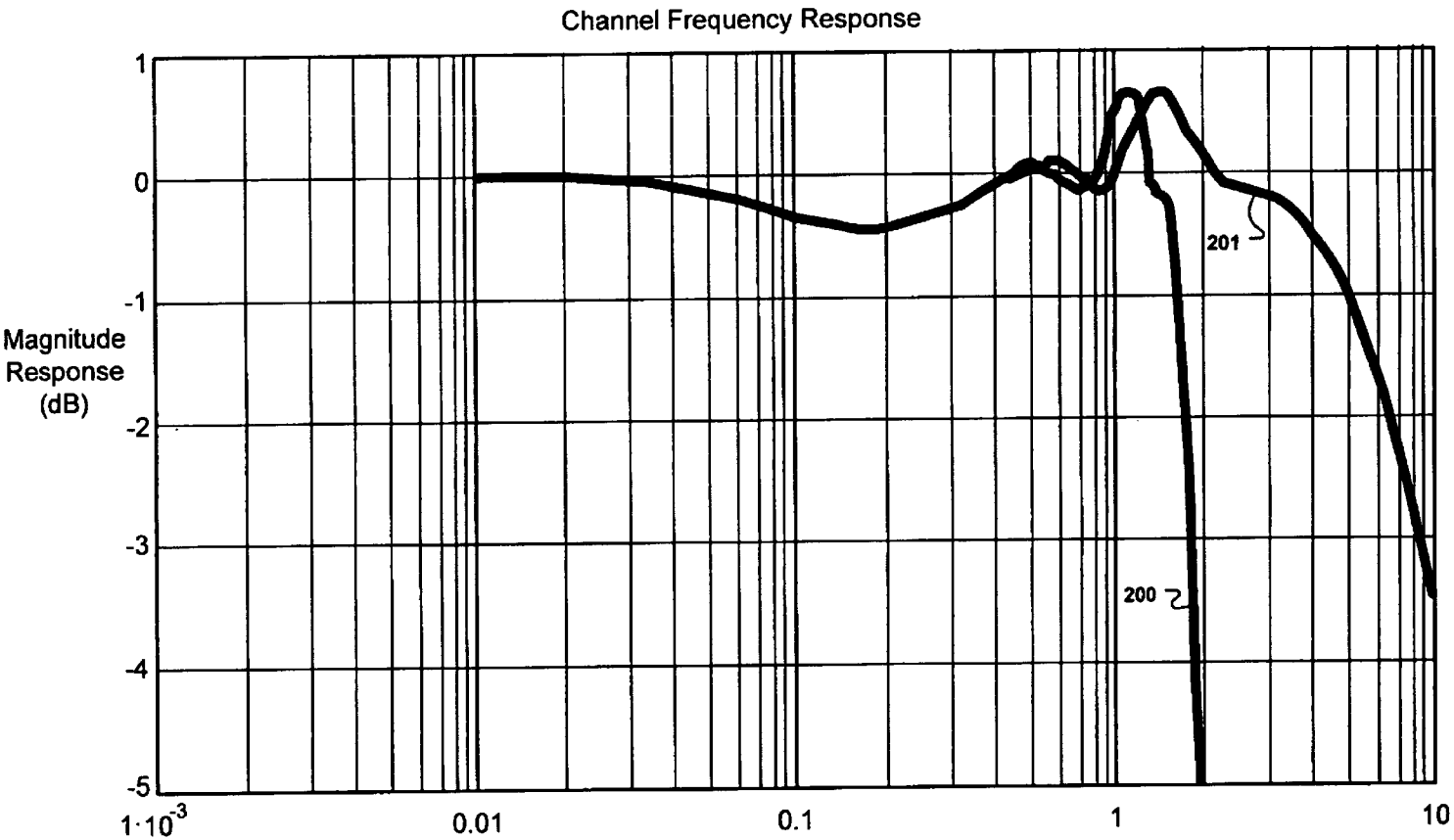
Figure 6
(Amended)

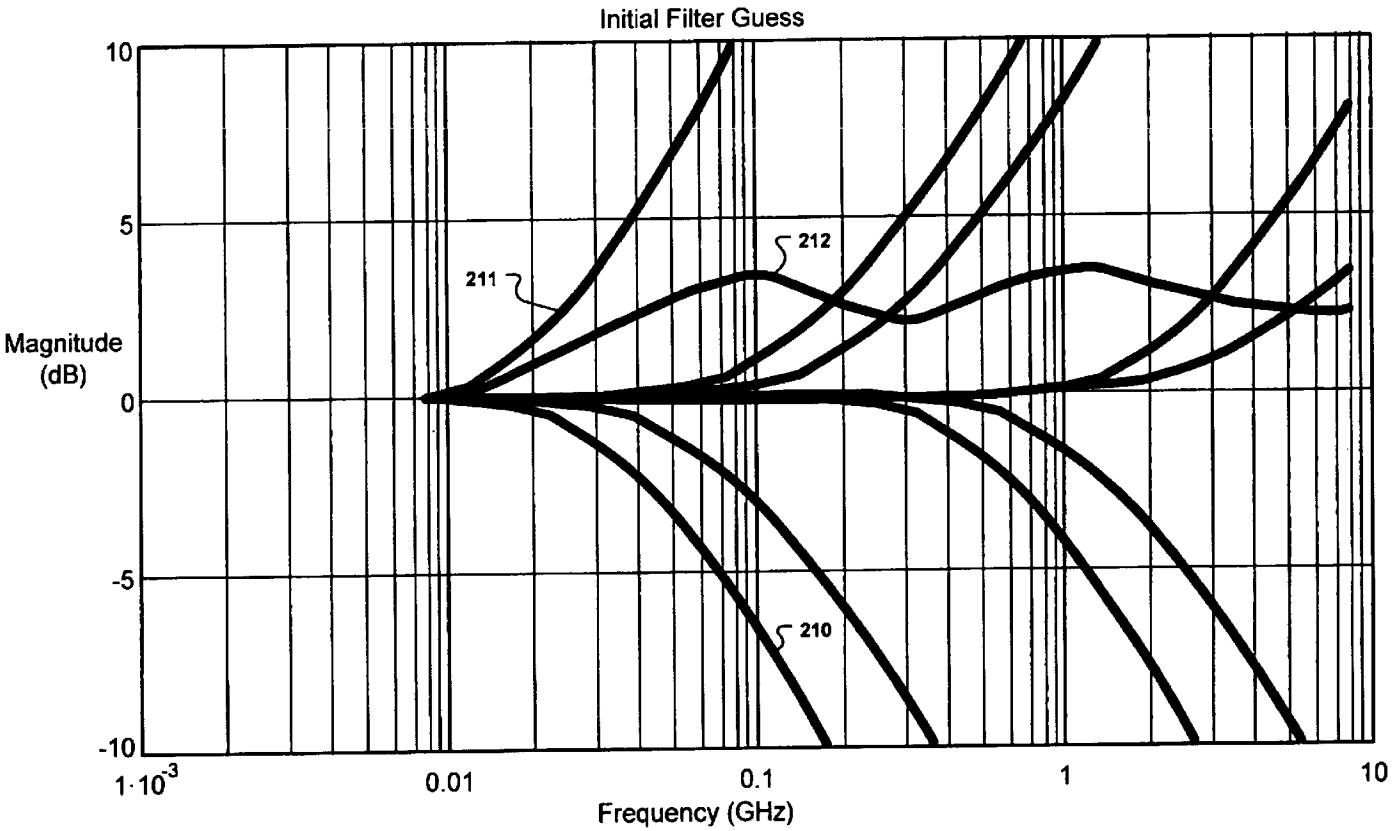
Figure 7
(Amended)

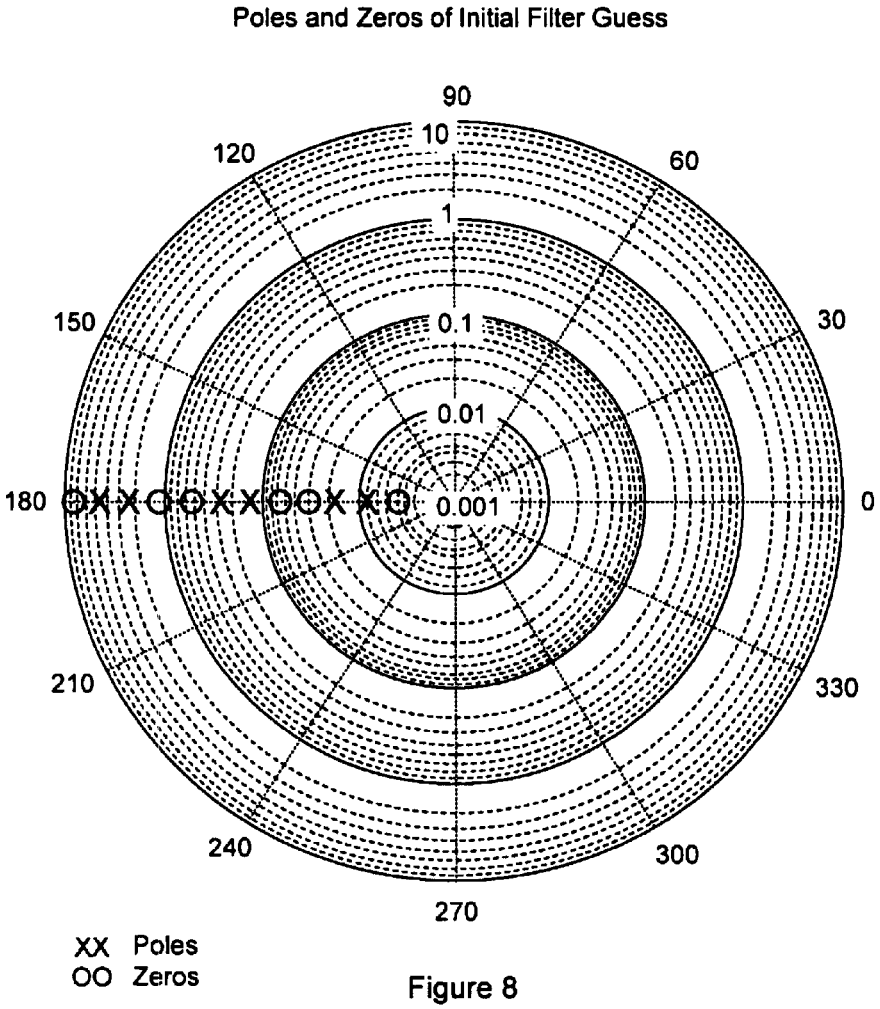
Figure 8
(Amended)

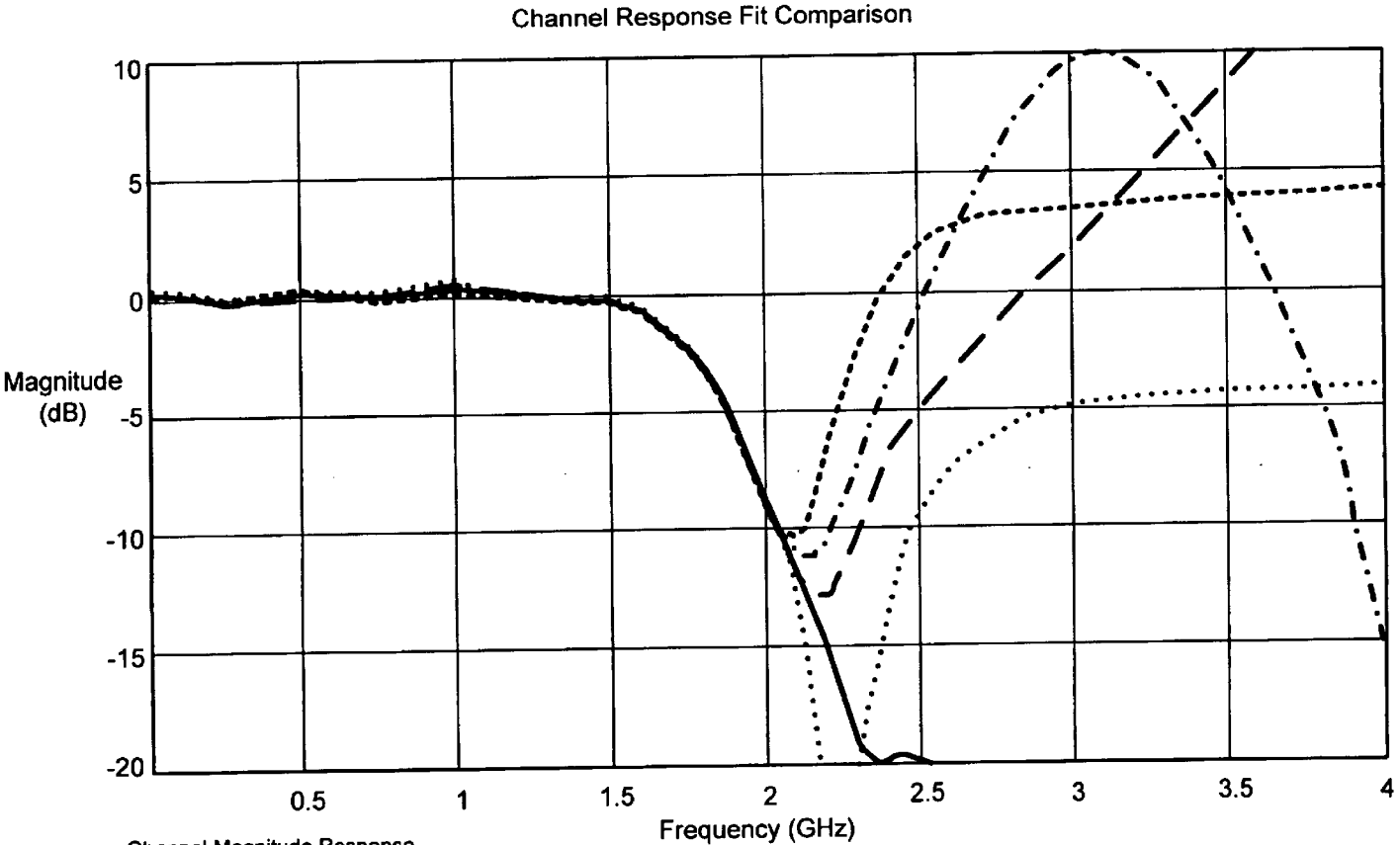
Figure 9
(Amended)

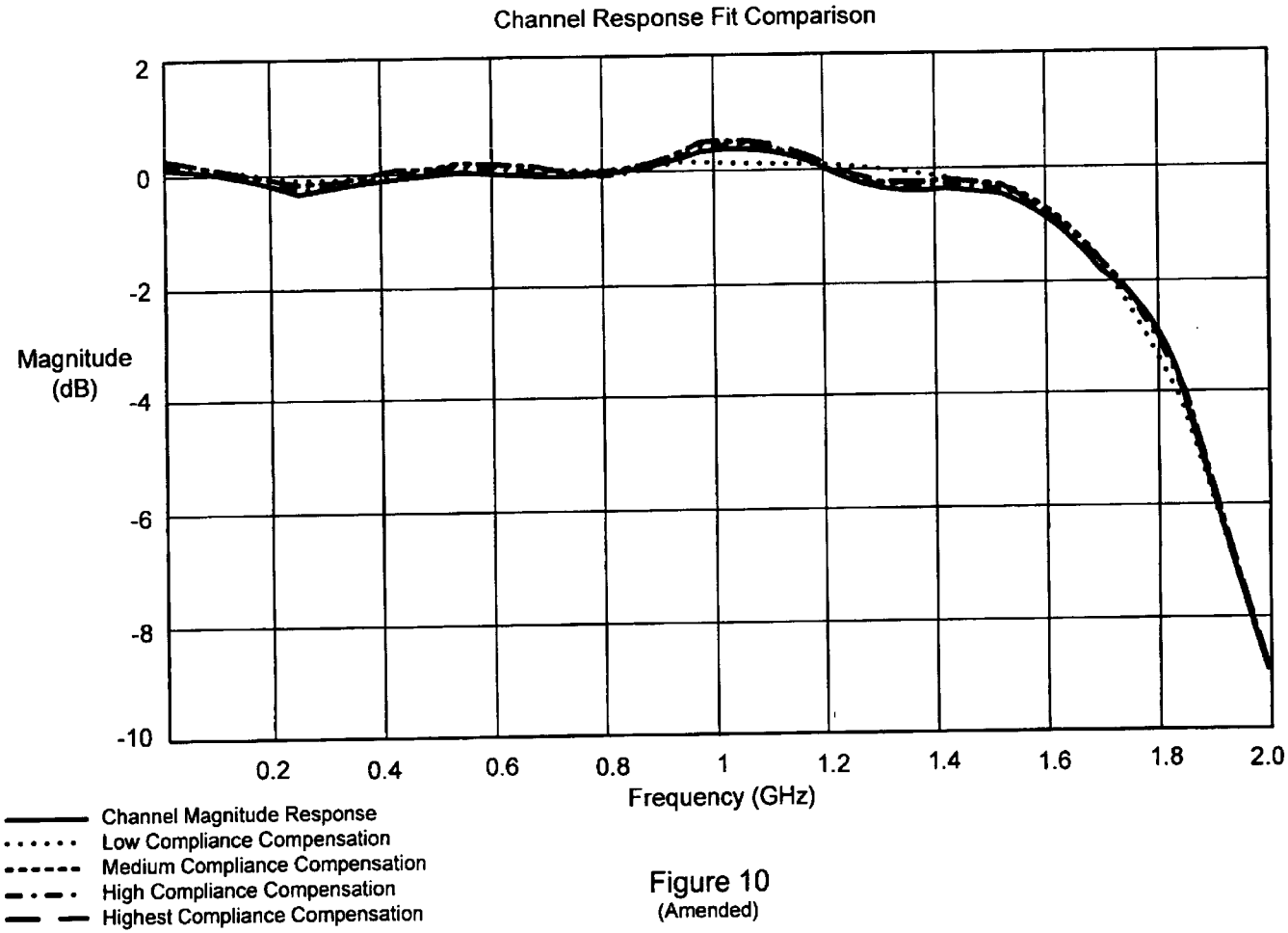
Figure 10
(Amended)

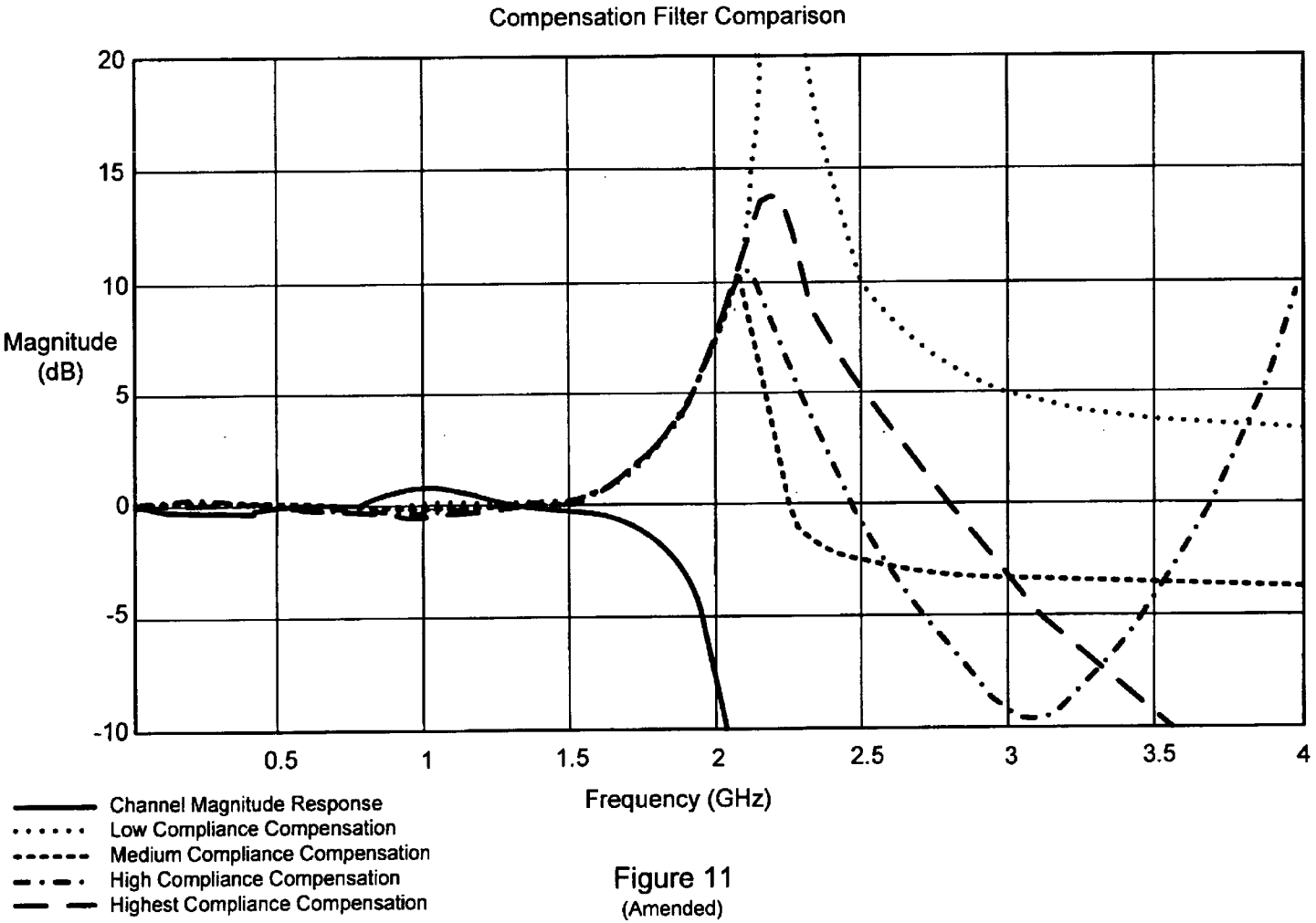
Figure 11
(Amended)

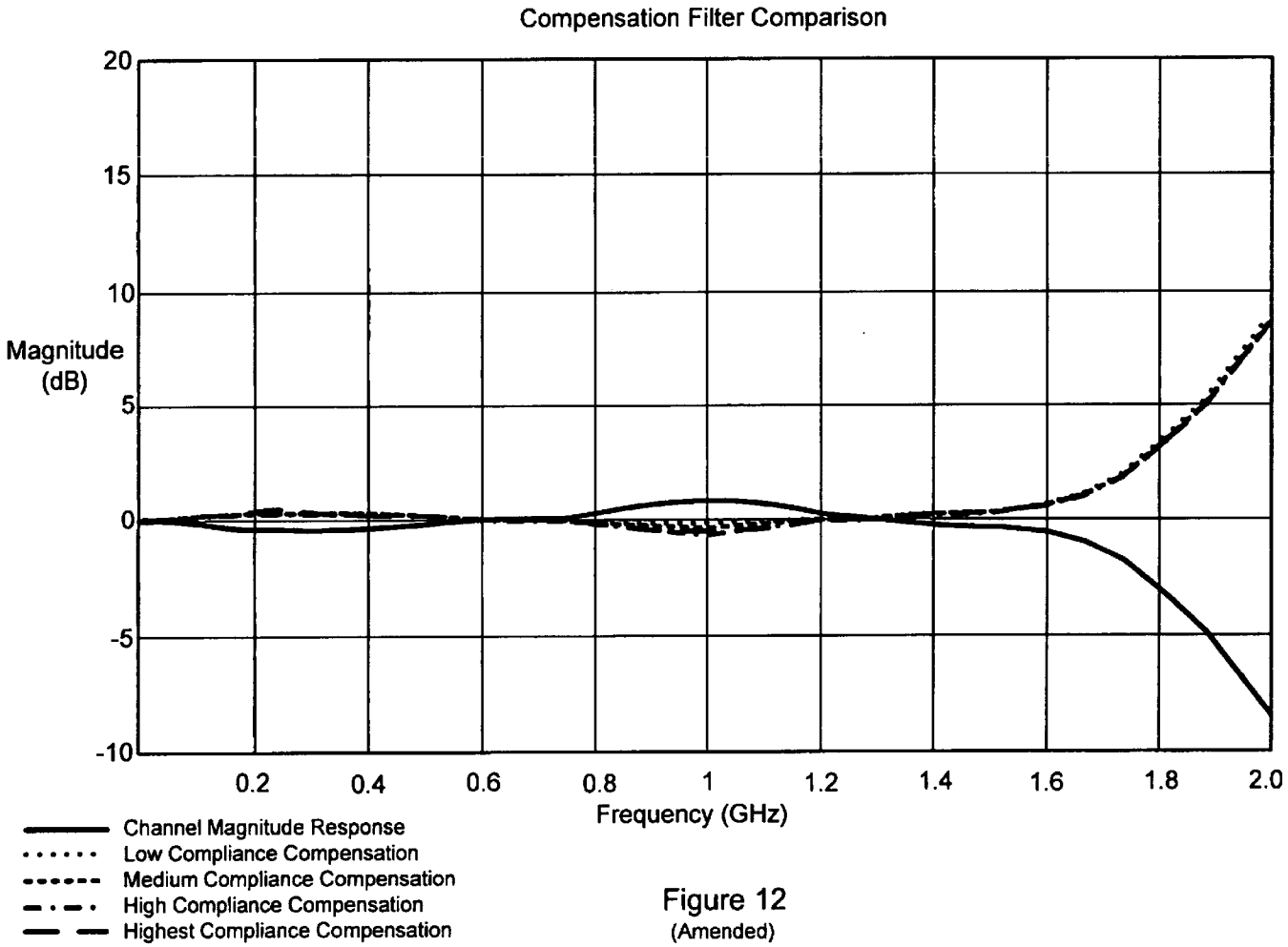
Figure 12
(Amended)

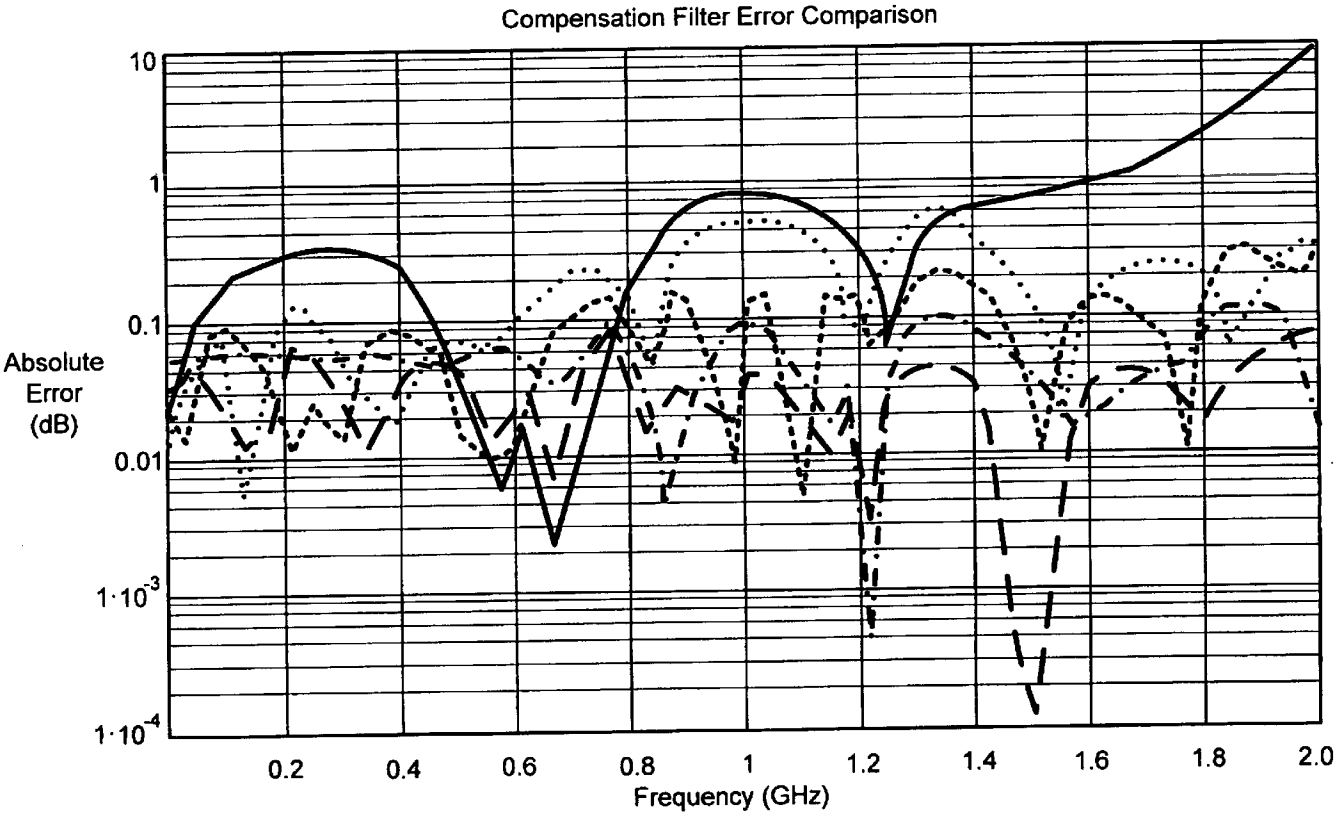
Figure 13
(Amended)

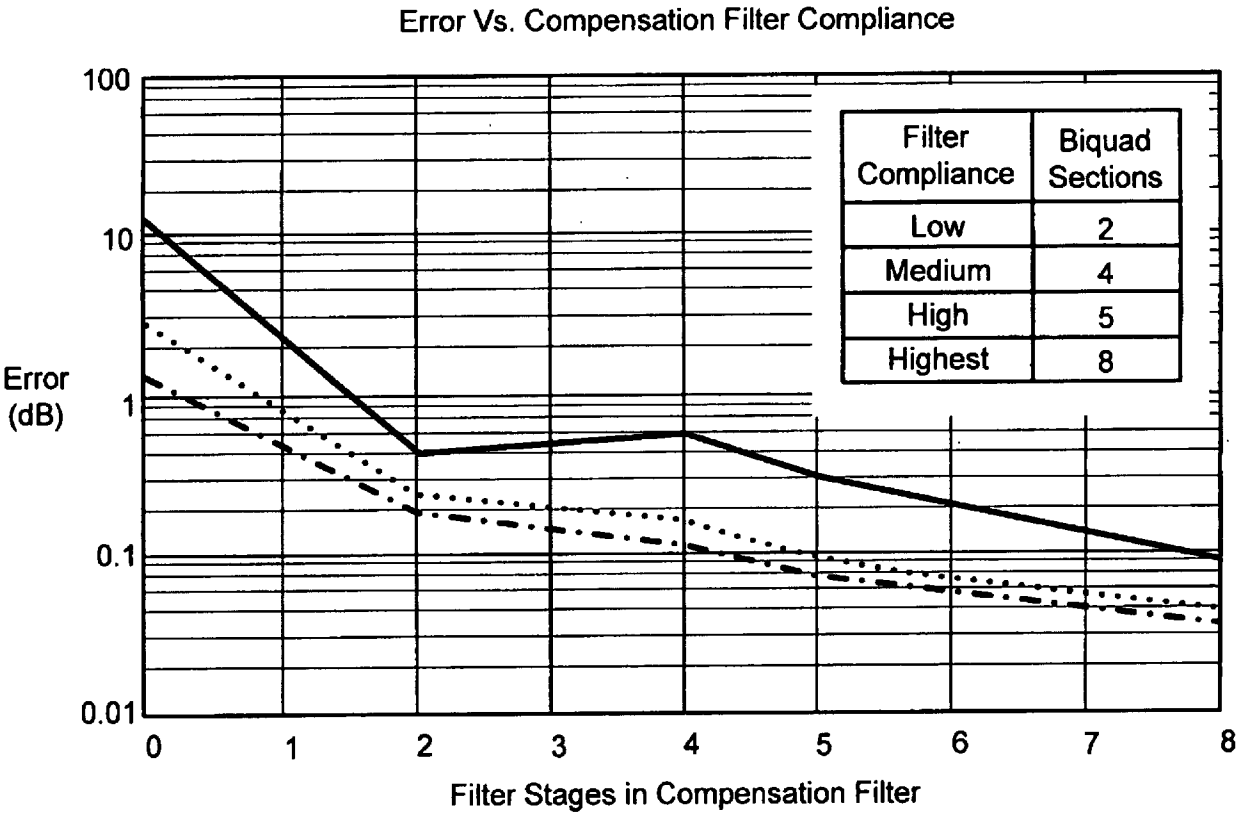
Figure 14
(Amended)

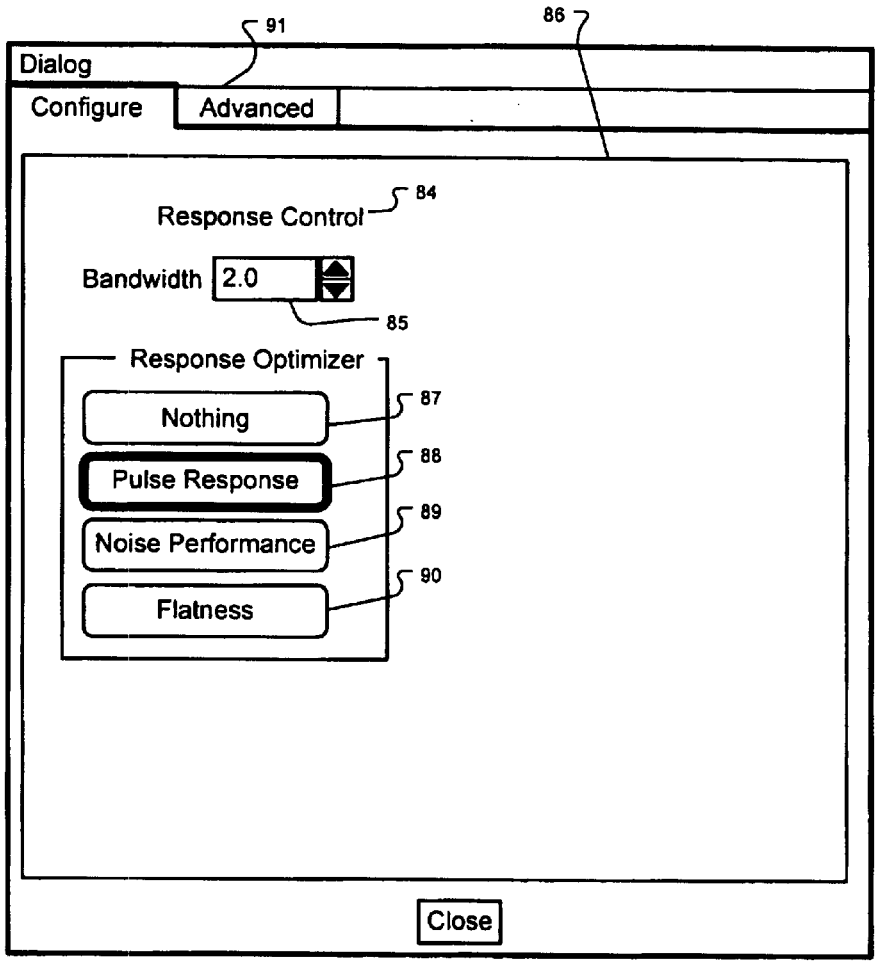
Figure 15
(Amended)

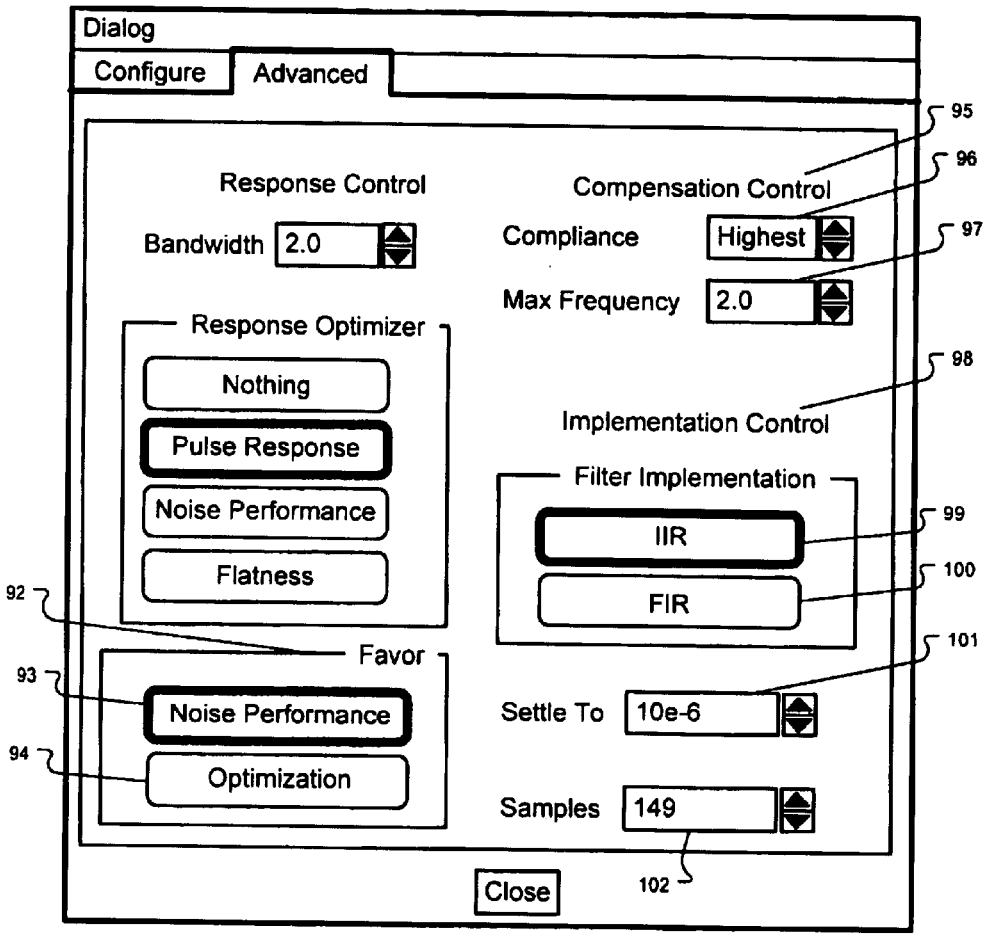
Figure 16
(Amended)

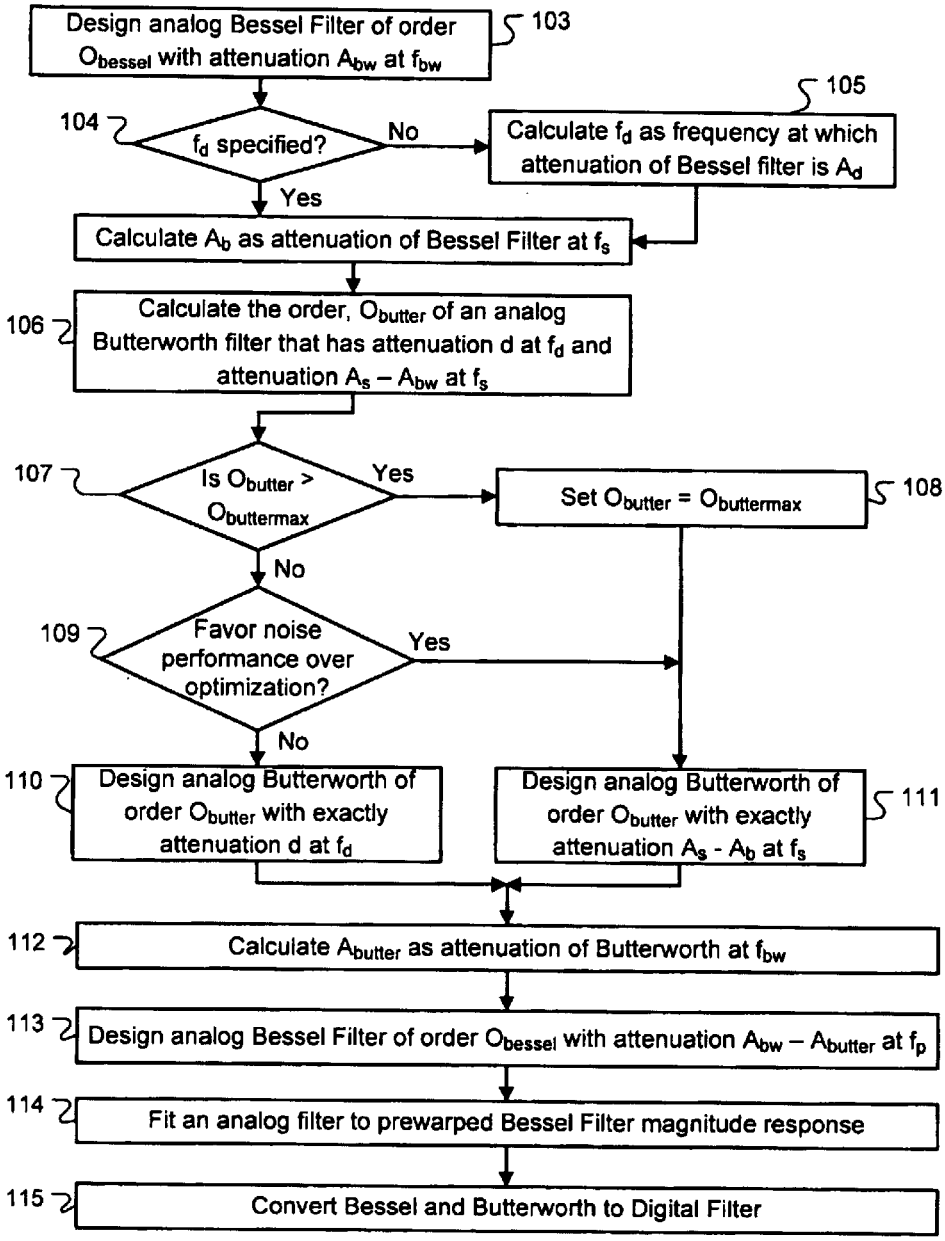
Figure 17
(Amended)

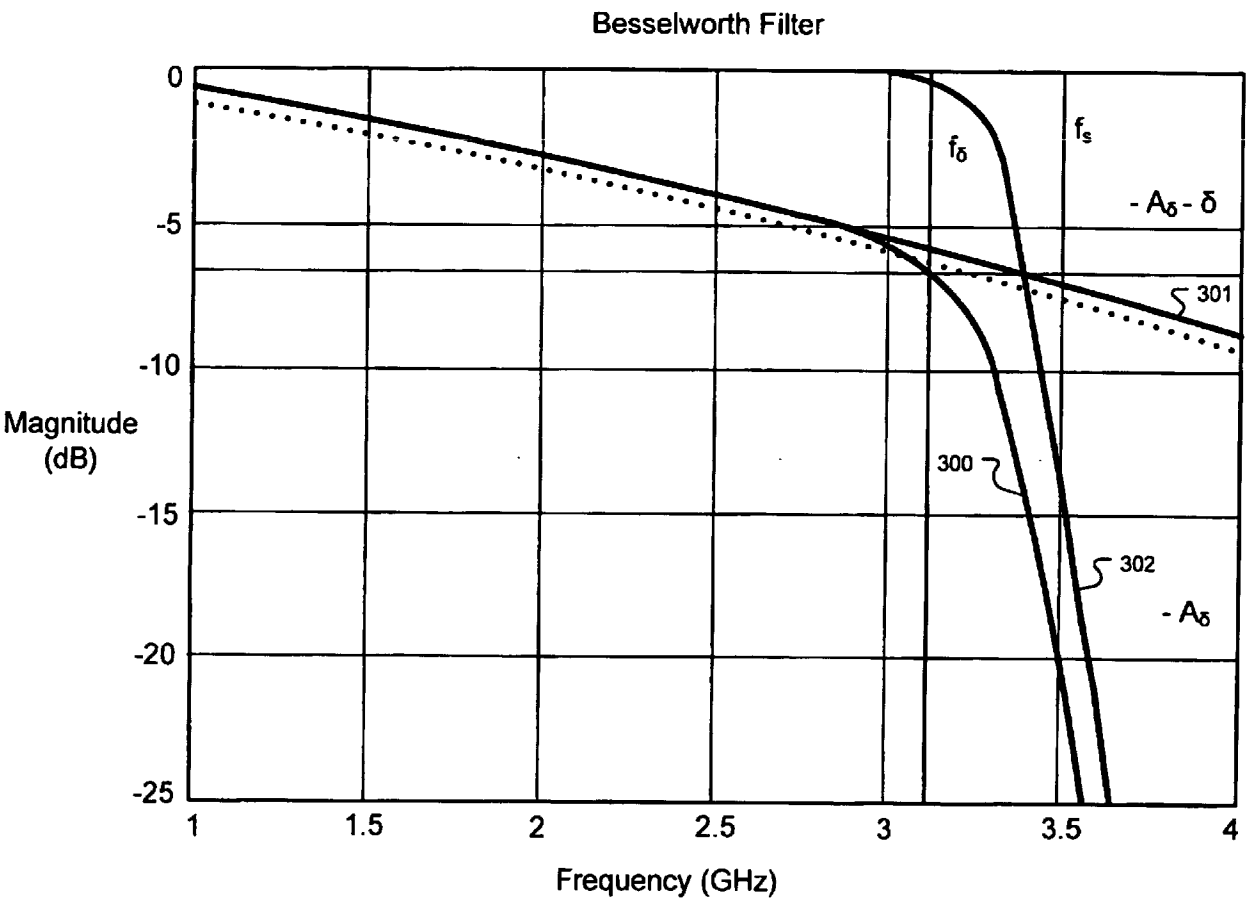
Figure 18
(Amended)

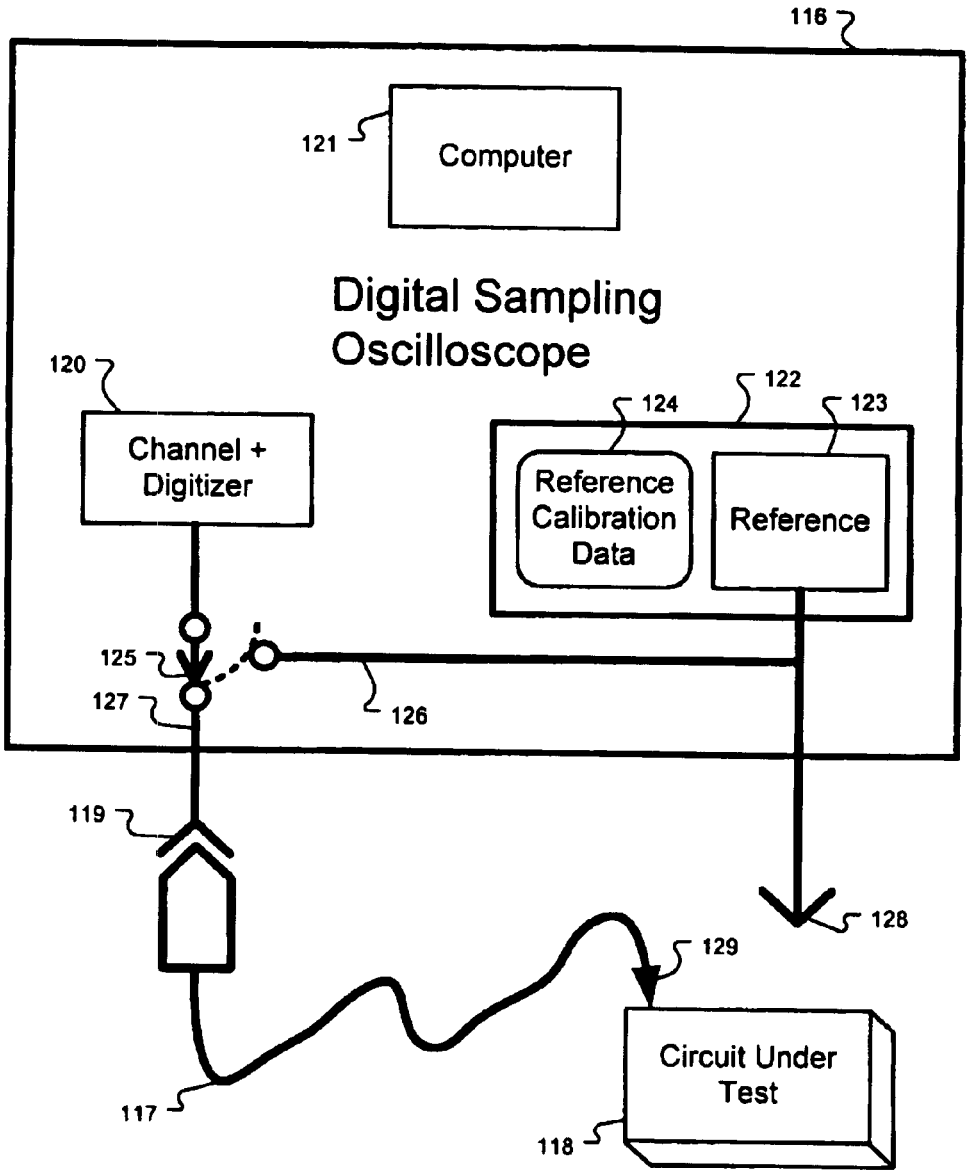
Figure 19
(Amended)

LeCroy WP9600234 12/11/01 23:17

Input Specifications:

Bandwidth: 1.5 GHz

Optimization: Pulse Response Bessel - 2nd order

Compliance: Highest

Max Compensation Frequency: 2 GHz

Response specified to deviate from Bessel response by no more than d=0.1 dB out to $A_d$ = 6 dB attenuation Implementation Notes:

$A_d$ changed from 6.0 to 5.164. Reason: $f_d$=2.2 exceeded Max Compensation Frequency.

Output Specifications:

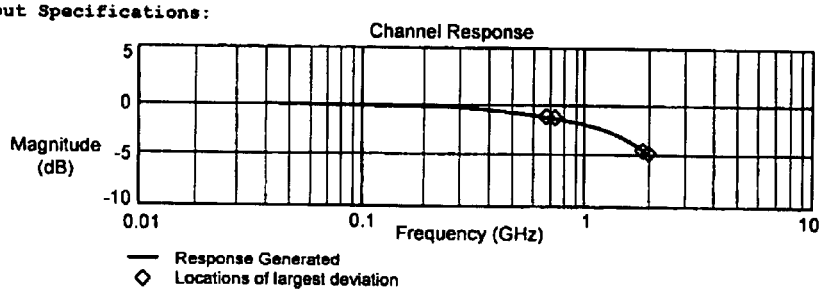

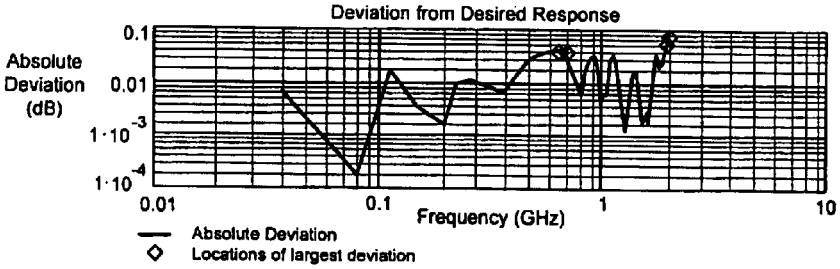

Maximum Absolute Deviation: 0.085 dB @ 2.00 GHz

Maximum Positive Deviation: 0.065 dB @ 1.96 GHz

Maximum Negative Deviation: -0.085 dB @ 2.00 GHz

Average Deviation: 0.020 dB

RMS Deviation: 0.026 dB

Attenuation at $f_p$ = 1.5 GHz: -2.94 dB

Bandwidth: 1.52 GHz

Five largest Deviation Points:

| | | | |
|---|---|---|---|
| -0.085 dB @ | 2.00 GHz | +0.065 dB @ | 1.96 GHz |
| +0.056 dB @ | 1.92 GHz | +0.042 dB @ | 0.72 GHz |
| +0.042 dB @ | 0.68 GHz | | |

Figure 20
(Amended)

DIGITAL FREQUENCY RESPONSE COMPENSATOR AND ARBITRARY RESPONSE GENERATOR SYSTEM

Matter enclosed in heavy brackets [ ] appears in the original patent but forms no part of this reissue specification; matter printed in italics indicates the additions made by reissue.

The entire contents of the following applications are hereby incorporated by reference: U.S. application Ser. No. 09/669,955 filed Sep. 26, 2000 now U.S. Pat. No. 6,542,914; U.S. application Ser. No. 09/988,120 filed Nov. 16, 2001 now U.S. Pat. No. 6,539,318; and U.S. application Ser. No. 09/988,420 filed Nov. 16, 2001.

BACKGROUND OF THE INVENTION

The present invention is directed to a digital signal processing (DSP) system having a digital frequency response compensator and an arbitrary response generator. More generally, the present invention relates to systems having an analog input signal, analog electronics (e.g. attenuators, gain elements, and buffers), and an analog-to-digital converter (ADC) for converting the analog input signal into a sequence of numbers that is a digital representation of the input signal. This invention pertains to instruments designed with the aforementioned components in order to acquire waveforms for the purpose of viewing, analysis, test and verification, and assorted other purposes. More specifically, this invention pertains to digital sampling oscilloscopes (DSOs), especially ultra-high bandwidth and sample rate DSOs and single-shot DSOs (sometimes referred to as real-time DSOs). These DSOs are capable of digitizing a voltage waveform with a sufficient degree of over-sampling and fidelity to capture the waveform with a single trigger event.

Traditionally, DSOs have been the primary viewing tool for engineers to examine signals. With the high-speed, complex waveforms utilized in today's communications and data storage industries, the simple viewing of wave forms has been de-emphasized and greater demand has been placed on DSOs that are also capable of analyzing the waveforms. This increased desire for DSO analysis capability requires a greater degree of signal fidelity (i.e. a higher quality digitized waveform). While greater demands for signal fidelity are being made, the desire for DSOs having higher bandwidth and sample rates similarly continues unabated. Unfortunately, a high-speed signal requires a high-bandwidth DSO, and a premium is paid for ultra-high bandwidth, high sample rate, real-time DSOs.

Sampling rates for digital oscilloscopes have been doubling approximately every 2–2½ years, with bandwidth doubling almost every 4 years. This increase in bandwidth has not come without a price. Often, analog components are stretched to their limits. Sometimes, peaking networks are used to stretch the bandwidth even further. This push for higher bandwidth often comes at the price of signal fidelity, specifically in the areas of pulse response (overshoot and ringing) and frequency response flatness. This is because peaking tends to be somewhat uncontrolled (i.e. it is difficult to peak-up a system while simultaneously maintaining a flat response). Further, since the analog components are stressed to their bandwidth limits, the frequency response often drops precipitously if the bandwidth is exceeded. Hence, high-bandwidth oscilloscopes no longer have gentle frequency response roll-up characteristics.

Despite this situation, DSO customer's baseline expectations have not changed. Customers still expect low-noise—even though noise increases by a factor of the square root of two for every doubling of the bandwidth—and they expect DSOs to have a certain roll-off characteristic.

Further complicating the situation is the fact that the design of high-speed DSOs involves a tremendous amount of trade-off and compromise. The three main traditional metrics of signal fidelity—noise, frequency response, and time-domain response—all compete against one another. As mentioned previously, pushing higher bandwidth through an oscilloscope increases the noise in the output signal. Any variation from the single-pole or double-pole frequency response characteristics increases the overshoot and ringing. Pushing the bandwidth of the hardware components to their limits only makes the problem worse. Flattening the frequency response can worse the pulse response. Improving the pulse response typically means reducing the bandwidth of the instrument (which is always undesirable). Because the DSO is a general-purpose instrument, the tradeoffs are chosen carefully but many customers are invariably unsatisfied. The only choice left to the user is between a few fixed bandwidth limits, which connect in a simple RC network. Even in bandwidth-limited modes, the response is often still not perfectly compliant with the single-pole response and can vary by up to 0.5 dB.

Compliance to a specified response is essential in the development of vertical market applications for a DSO where the scope emulates, for example, particular communication or disk-drive channels. The capability to emulate channels provides a rapid prototyping and analysis capability.

SUMMARY OF THE INVENTION

Therefore, in accordance with the present invention, a component capable of compensating for degradation due to increased bandwidth is provided (i.e. frequency response flatness and/or compliance to a particular desired response characteristic).

Further in accordance with the present invention, an adjustable component capable of making trade-offs with regard to noise, flatness and/or pulse response characteristics, rather than relying on static instrument characteristics is provided. The adjustable component thereby allows the instrument to be optimized for a given measurement.

In accordance with the present invention, a capability using the adjustable component to feedback the response characteristics of the instrument to the user is provided.

Still further in accordance with the present invention, a component capable of being calibrated for changing channel response characteristics is provided.

A preferred embodiment of the invention provides a signal processing system capable of compensating for a channel response characteristic of an input waveform. The system comprises input specifications, a filter builder, and a filter. The input specifications are used to specify the design of the filter and include channel response characteristics defining the response characteristics of a channel used to acquire the input waveform, and user specifications for specifying a desired frequency response and a degree of compliance to the desired frequency response. The filter builder generates coefficients for the filter and outputs final performance specifications. The filter has a compensation filter generator for generating coefficients corresponding to a compensation response on the basis of the inverse of the channel response characteristics, and a response filter generator for generating coefficients corresponding to a combination of an ideal response and a noise reduction response on the basis of the user specifications. The filter filters the input waveform and outputs an overall response waveform having a desired frequency response. The filter is comprised of a filter coefficient cache for storing the coefficients generated by the filter builder, a compensation filter portion for filtering the input waveform in accordance with the coefficients stored in the filter coefficient cache corresponding to the compensation response, and a response filter portion having a response filter stage and a noise reduction stage for filtering the compensated waveform output from said compensation filter portion that outputs the overall response waveform. The response filter portion filters using the coefficients stored in the filter coefficient cache corresponding to the combination of the ideal response and the noise reduction response.

In another aspect of the invention, the filter may be implemented as an infinite impulse response (IIR) filter or a finite impulse response (FIR) filter.

In a further aspect of the invention, the channel response characteristics may be predetermined based on a reference signal and the reference signal as acquired by the channel.

In still another aspect of the invention, the user specifications may comprise a bandwidth, a response optimization, a compensation compliance, and a filter implementation type. The response optimization may be a pulse response optimization implemented using a Besselworth filter, a noise performance optimization implemented using a Butterworth filter, or a flatness optimization implemented using a Butterworth filter. The filter implementation type may be finite impulse response (FIR) or infinite impulse response (IIR).

In accordance with a further embodiment of the invention, a signal processing element for filtering an input digital waveform is provided. The element comprises a filter builder, an infinite impulse response (IIR) filter, a finite impulse response (FIR) filter, and an output selector switch. The filter builder is used for generating filter coefficients on the basis of a channel frequency response and a user response characteristics. The channel frequency response is determined on the basis of a response input and a correction input. The infinite impulse response (IIR) filter has an IIR input for the input digital waveform and an IIR coefficient input connected to the filter builder. The IIR filter produces an IIR filtered waveform from the input digital waveform on the basis of the filter coefficients generated by the filter builder. The finite impulse response (FIR) filter has an FIR input for the input digital waveform and a FIR coefficient input connected to the filter builder. The FIR filter produces a FIR filtered waveform from the input digital waveform on the basis of the filter coefficients generated by the filter builder. The output selector switch selects either the IIR filtered waveform or the FIR filtered waveform for output.

In this embodiment, the filter builder detects changes in the sampling rate of said input digital waveform that may require the filter coefficients to be changed and regenerated. The filter builder generates filter coefficients for the FIR filter or the IIR filter on the basis of the output selector switch. The filter builder has channel, compensation, shaper, and noise reduction outputs for evaluating the performance of the filtering.

In another aspect of this embodiment, the response input is a known input response and the correction input is a measured input response as acquired by an input channel. The user response characteristics are used to generate filter coefficients corresponding to an arbitrary response portion of the filter. The user response characteristics comprise a bandwidth, a response optimization, a compensation compliance, and a filter implementation type. The response optimization may be a pulse response optimization implemented using a Besselworth filter, a noise performance optimization implemented using a Butterworth filter, or a flatness optimization implemented using a Butterworth filter. The filter implementation type may be FIR or IIR.

In yet another embodiment of the invention, a method of filtering an input digital waveform to compensate for the response characteristics of an acquisition channel is provided. The method first generates a compensation portion of a filter on the basis of an input channel response by pre-warping the input channel response, designing an analog filter emulating the pre-warped input channel response by making an initial filter guess and iterating the coefficients of the initial filter guess to minimize a mean-squared error, inverting the analog filter, and digitizing the inverted analog filter to produce the compensation portion of the filter using a bilinear transformation. The method then generates an arbitrary response portion of the filter on the basis of an input user specifications. Finally, the method filters the input digital waveform using the compensation portion of the filter and by the arbitrary response portion of the filter, thereby producing a filtered digital waveform having the desired response characteristics.

In accordance with this embodiment, the arbitrary response portion of the filter is comprised of a shaper and a noise reducer. The coefficients of the initial filter guess are iterated until the mean-squared error is less than a compensation compliance specified in the input user specifications.

In another aspect of this embodiment, the filter may be implemented as an infinite impulse response (IIR) filter or a finite impulse response (FIR) filter.

In yet another aspect of this embodiment, the channel response characteristics may be predetermined based on a reference signal and the reference signal as acquired by the channel.

In still another aspect of the embodiment, the user specifications may comprise a bandwidth, a response optimization, a compensation compliance, and a filter implementation type. The response optimization may be a pulse response optimization implemented using a Besselworth filter, a noise performance optimization implemented using a Butterworth filter, or a flatness optimization implemented using a Butterworth filter. The filter implementation type may be finite impulse response (FIR) or infinite impulse response (IIR).

Other objects and advantages of the invention will in part be obvious and will in part be apparent from the specification and the drawings.

BRIEF DESCRIPTION OF THE DRAWINGS

For a more complete understanding of the invention, reference is made to the following description and accompanying drawings, in which:

FIG. 1 shows the frequency response compensator and arbitrary response generator system according to the present invention;

FIG. 2 illustrates the frequency response of a channel and a compensation and response generation system;

FIG. 3 shows the frequency response compensator and arbitrary response generator system according to the present invention within a processing web;

FIG. 4 shows the internal structure of component 33 shown in FIG. 3;

FIG. 5 shows an acquired time-domain reference signal and a channel frequency response calculated therefrom;

FIG. 6 shows a pre-warped channel frequency response;

FIG. 7 shows the filter response for an initial guess at approximating the response shown in FIG. 6;

FIG. 8 shows the pole and zero locations for the initial filter guess in FIG. 7;

FIG. 9 shows the frequency response of digital filters with varying degrees of compliance that emulate the response shown in FIG. 6;

FIG. 10 is an enlarged view of the frequency band in FIG. 9 in which compliance is enforced;

FIG. 11 shows the frequency response of digital filters with varying degrees of compliance that compensate the response shown in FIG. 6;

FIG. 12 is an enlarged view of the frequency band in FIG. 11 in which compliance is enforced;

FIG. 13 shows the compensation filter error for the filters in FIG. 12;

FIG. 14 shows the compensation filter error as a function of the number of filter stages;

FIG. 15 shows the configuration user interface for specifying a filter;

FIG. 16 shows the advanced user interface for specifying a filter;

FIG. 17 is a flowchart of a procedure for designing a Besselworth filter;

FIG. 18 shows the frequency response of a Besselworth filter;

FIG. 19 shows a calibration arrangement for a DSO in accordance with the present invention; and FIG. 20 shows an example output performance specification in accordance with the present invention.

DETAILED DESCRIPTION OF THE PREFERRED EMBODIMENTS

The preferred embodiments of the system according to the present invention will be described with reference to the accompanying drawings.

The present invention is a signal processing system having a digital frequency response compensator and an arbitrary response generator. The invention includes a filtering operation that is performed by a signal processing element located in the signal path of a DSO, between the ADC and any downstream processing of the digitized waveform. The filtering operation is executed during and/or after readout and prior to display or further processing of the waveform. DSOs generally have a high performance central-processing unit (CPU) for processing the acquired waveforms for analysis or display. The digital filtering operation according to the present invention may be implemented in software on this CPU within the DSO.

The purpose of this digital filtering operation is to alter the frequency response of the DSO. This filter is designed such that by the adjustment of its filtering characteristics, the entirety of the DSO's system (including the channel input, the digitizing elements, and the present invention) has a specific, prescribed frequency response. In other words, the digital filter does not merely filter the frequency response, but causes the entire system to have a prescribed frequency response. Most filters are simply designed to have a particular effect on the signal input to the filter, but not to provide a particular overall system response.

FIG. 2 illustrates the steps in processing the frequency response of a DSO channel using a compensation and response generation system according to the present invention. Input response plot 17 shows the frequency response for a typical input channel. Note the channel does not have a flat frequency response. A typical desired frequency response is shown by ideal response plot 20. However, a user may want to specify other frequency responses.

The present invention transforms response plot 17 into overall response plot 16 utilizing the digital filter shown in 18. Note that this response is not the exact ideal response 20, but it is the best response possible given the hardware bandwidth of the channel. Digital filter 18 is comprised of three internal filter stages: compensation filter 19, ideal response filter 20 and cutoff filter 21.

FIG. 2 also shows the effect of each of these filter stages on the signal by showing the overall response of the system at each successive filter stage. The effect of each filter stage is shown by simply adding the frequency responses at each stage. Recall that the original system response is shown by the channel frequency response 17, 22. The channel response 22 is first processed by the compensation stage 23, resulting in the compensated channel response [27] *24*, which is essentially flat. The compensation filter stage 23 is the opposite/inverse of the channel response 22. Note that several plots (e.g., channel response 22) have a shaded portion (25) on the right side of the plot. The shading indicates where the response is so attenuated that the exact response is unknown. The compensated response 28 is then passed through the ideal response filter stage 30 resulting in the output response 29. However, note that the output response still has unknown content in the shaded region. This uncertainty is resolved by processing with cutoff stage 31. The cutoff produces a known overall response 32.

Prior attempts at this type of invention have failed in part because of difficulties in implementing the compensation filter portion. The design of the compensation filter is difficult because it is based on the channel response, which is highly variable.

Although the final filter is implemented in its entirely without regard to the effect of each stage, the design of the filter is split into two steps. This is because the response filter and cutoff filter are designed together. This two step approach simplifies the design of the filter and reduces the filter calculation time during operation. This is because only the compensation filter portion needs to be rebuilt if the channel frequency response changes. Similarly, if the user changes the response specifications, only the response portion needs to be rebuilt. In other words, the compensation and response filter designs are decoupled. This decoupling is demonstrated by the fact that the compensation filter output is designed to generate a fixed output frequency response specification (i.e. a response that is flat). Thus, the channel frequency response determines the design of this filter portion. The response filter portion assumes that its input response is flat; therefore only the response output specifications affect the design.

FIG. 1 shows the frequency response compensator and arbitrary response generator system 1 according to the present invention. Note that the filter 4 consists of the three filter stages discussed previously. Waveforms are input to the system at input 2 and pass through the aforementioned filter stages: compensation 5, response 6, and noise-reduction 7 (or cutoff). The response 6 and noise reduction 7 are grouped together as the response filter portion 8. The filter detail is shown as infinite impulse response (IIR) biquad sections, which is the preferred but not required implementation.

The filter 4 contains a filter coefficient cache 9 that contains the coefficients defining the filter. The filter coefficients are supplied by the filter coefficient builder (or filter builder) 10. Filter builder 10 is divided into two sections: the compensation filter generator 11 and the response filter generator 12. The compensation filter generator 11 generates filter coefficients for the compensation response 19 in FIG. 2. The response filter generator 12 generates filter coefficients for a combination of ideal response 20 and noise reduction (or cutoff) response 21, as shown in FIG. 2.

The input specifications to the filter builder consist of two parts: the channel response characteristics 13 and the response and compensation specifications 14. Channel response specifications 13 are based on the response of the input channel while the response and compensation specifications 14 are specified by the user. The response and compensation specifications 14 specify the desired response and the desired degree of compliance to this response. The channel response 13 and user specifications 14 completely specify the desired system performance. The channel response may be determined through factory calibration or be dynamically calibrated using a reference standard. In the case of dynamic calibration, the reference standard may be either internally provided or external to the unit. Response and compensation specifications 14 are graded to allow for tight control of the desired response, while allowing for easy control of the system.

The degree of compliance allows the user to fine tune the system. Large, complex digital filters will result if the desired response specification is exotic, or if the desired degree of compliance is very high. Such filters require large amounts of processing time which reduces the instrument update rate. Thus, the degree of compliance should be balanced with the impact of the instrument update rate.

Compensation filter generator 11 builds the compensation portion of the filter. As discussed previously, this portion is effectively the inverse of the channel response. The main difficulty with the design of this portion is that the channel response may be somewhat arbitrary and the specification may require stating the entire channel frequency response. This leads to a filter design that involves a least-squares error (L2) minimization between the input specification and the final output response of the filter. Unfortunately, when stated as an L2 minimization, a set of non-linear equations results which must be solved using non-linear equation solving methods. The fact that the equations are non-linear means that there is no guarantee that L2 will be minimized—only that a local minimum will be found. While this can be dealt with in a laboratory setting, failure of the system is not tolerable in most real-world applications. Furthermore, the instrument does not have an indefinite amount of time to calculate the filter. Therefore, measures must be taken to maximize the chance of success of the filter design and to calculate the filter in a speedy manner.

Response filter generator 12 translates the user specifications 14 and builds the response filter. The response filters are usually a combination of filters types that are generally compatible with IIR filter designs (e.g. Butterworth, Bessel, Inverse Chebyshev). Other filter types may also be used.

The following description of the preferred embodiment explains how the invention deals with this filter building problem. Once the filter portions have been built, the filters are cascaded and are capable of continuously filtering input waveforms, providing the overall system response as stated. Because of the uncertainty involved in the design of the compensation filter portion, the user should have the capability to examine the final overall system performance. For this reason, a set of final performance specifications 15 based on the designed filter is provided as feedback to the user.

The present invention has been implemented within a new software development platform for LeCroy DSOs. The main features of the software platform that are used by this invention are the "streaming architecture" and the "processing web"—both of which comprise a system that manages the interconnection of processing objects and data flow through these objects. See U.S. application Ser. No. 09/988,120 filed Nov. 16, 2001 and U.S. application Ser. No. 09/988,420 filed Nov. 16, 2001 incorporated herein by reference. Each processing object in the software, including the present invention, is implemented as an ATL COM object.

FIG. 3 shows the frequency response compensator and arbitrary response generator system according to the present invention integrated within a software processing web. Note that the operation of the processing web may not interact directly with the DSO user, but rather may simply provide the underlying object connectivity. In other words, FIG. 3 represents processing object connectivity within a DSO, as established via internal DSO software.

In FIG. 3, the filter component 33 according to the present invention is shown in an example system configuration. Filter component 33 has three inputs (Input 34, Resp 35, and Corr 36) and five outputs (Output 37, Chan 38, Comp 39, Shape 40, and Noise 41). Input 34 is shown connected to the channel 1 output 43 of an acquisition system component 42. Output pin 43 is the channel output of the digitizing hardware of the oscilloscope. Component 42 continuously acquires waveform for input 34. In this arrangement, component output 37 provides a compensated waveform output that has been digitally filtered to meet the specifications provided. Output 37 is connected to a Renderer 44 that draws the waveform on the oscilloscope screen. The Response input 35 and Correlation input 36 provide the filter specifications for determining the channel response. Response input 35 is connected to the waveform importer component 45. In this case, the waveform importer is reading a step response, previously acquired from the same channel, from a disk. Correction input 36 is connected to another waveform importer component 46, which is reading the actual frequency content of the previously acquired step response. The combination of the Resp 35 and Corr 36 inputs provides filter component 33 with sufficient information to determine the channel frequency response. The other parts of the filter specifications are provided through dialog boxes, shown in FIG. 15 and FIG. 16 (described later). The Chan 38, Comp 39, Shape 40, and Noise 41 filter component outputs provide frequency response waveforms that are indicative of the performance of the system. Channel response 38 outputs the frequency response of the channel determined by the Resp 35 and Corr 36 inputs. Compensation response 39 provides the compensation frequency response of the digital filter designed to counter the channel frequency response. Shaper 40 and Noise reducer 41 output the frequency response of two filter portions that together provide the response characteristic specified by the user in the dialog boxes shown in FIG. 15 and FIG. 16. The Shaper portion of the digital filter is specifically designed to match a specified frequency response characteristic. The noise reducer portion is designed to provide a sharp attenuation of the input waveform beyond the frequencies of interest. The Chan 38, Comp 39, Shape 40, and Noise 41 filter frequency response outputs are provided in decibels and can be added algebraically to examine system performance, as shown in Table 1 below.

TABLE 1

| Algebraic Combination | Output (frequency response) |
|---|---|
| Chan | Channel |
| Comp | Compensation filter portion alone |
| Shape | Response generator portion alone |
| Noise | Noise reducer portion alone |
| Shape + Noise | Specified response |
| Comp + Shape + Noise | Overall filter response |
| Chan + Comp + Shape + Noise | Overall system response with filter |
| Chan + Comp | Deviation of overall response from response specified. (error) |

In FIG. 3, the four frequency response outputs (38–41) are shown connected to adder components 47, 48, and 49. Two desired frequency response views are displayed using renderers 50 and 52, which are zoomed by components 51 and 53. Renderer 50 displays the channel frequency response while renderer 52 displays the overall system frequency response, i.e. the sum of the Chan 38, Comp 39, Shape 40, and Noise 41 outputs.

A detailed view of filter component 33 is shown in FIG. 4. Component 33 is actually a composite of several components. Each of these internal components is also implemented as a separate ATL COM object. The two top components (IIR filter 54 and finite impulse response (FIR) filter 55) are the actual filter elements and the larger component at the bottom is the filter builder 56. Both filter inputs 57 and 58 are connected directly to the input pin 59 where the DSO waveforms from the digitizing hardware are input. Likewise, both filter outputs 60 and 61 are connected to output pin 62 (through a switch 79). The setting of switch 79 is determined either directly by the user or through an optimization performed during filter building.

These filters have been implemented on an Intel Pentium™ processor, using the Intel Performance Library—a set of dynamic-link libraries (DLLs) containing biquad IIR and FIR filter code specifically optimized for the processor. See Intel Signal Processing Library Reference Manual, Doc No. 630508-012, Intel Corp., 2000, Chapter 8. The fact that these filters can be implemented utilizing Intel libraries is only one possible embodiment, but is not necessary to the invention. Any other appropriate equivalent implementation may be employed. (Pentium™, and Intel Inside™ are trademarks of the Intel Corporation)

The Coef inputs 63 and 64 are connected to the Coef output pin 65 of the filter builder 56. The coefficients for the filters are generated based on the type of filter as indicated by output switch 62. If the FIR filter 55 is selected, then the coefficients are sent as a series of numbers $a_0$, $a_1$, $a_2$, $a_3$, . . . and the overall filter response is:

$$H(z) = \sum_t a_2 \cdot z^{-k} \qquad \text{Equation 1}$$

If the IIR filter 54 is selected, then the coefficients are sent in groups of six with each group representing a biquad section. The sequence of numbers is sent as $a_{0,0}$, $a_{1,0}$, $a_{2,0}$, $b_{0,0}$, $b_{1,0}$, $b_{2,0}$, $a_{0,1}$, $a_{1,1}$, $a_{2,1}$, $b_{0,1}$, $b_{1,1}$, $b_{2,1}$, . . . The transfer function for each section is denoted by:

$$H_a(z) = \frac{a_{0,1} + a_{1,2} \cdot z^{-1} + a_{2,1} \cdot z^{-2}}{b_{0,1} + b_{1,2} \cdot z^{-1} + b_{2c} \cdot z^{-2}} \qquad \text{Equation 2}$$

where $b_{0,s}$ is always set to 1.0

The overall filter response for the IIR filter is:

$$H(z) = \prod_s H_s(z) \qquad \text{Equation 3}$$

Input pin 59 is also connected to the filter builder input 66 for the purpose of detecting changes in the sample rate of the input waveform which may require the digital filter to be rebuilt. The resp 67 and corr 68 inputs are tied to the filter builder resp 69 and corr 70 inputs. The four frequency response outputs of the filter builder 75–78 are connected directly to the composite system outputs 71–74.

The filter builder 56 requires two sets of specifications (the channel frequency response and the user response specifications) to produce output coefficients. The channel frequency response is used to build the compensation portion of the filter. The user response specifications are used to build the arbitrary response portion of the filter.

The channel frequency response is calculated from the response 69 and correction 70 input pins to the filter builder 56. Response is the measured response to a known input stimulus to the channel. Correction is the actual, known frequency response or frequency content of the input stimulus. As with all measurement instrument calibrations, a source must be traceable to a known standard. Thus, knowing the frequency content of a source waveform (known by measurement utilizing another calibrated instrument), and knowing the instrument's response to this waveform (specifically, the response of the channel of the DSO into whose data stream this processing element is placed), the frequency response of the channel may be determined. If $H_c$ denotes the unknown frequency response of the channel, $H_s$ the known frequency content of the calibration waveform, and $H_m$ the frequency content of the scope channel as measured by the uncompensated DSO, then:

$$H_m = H_s \cdot H_c \qquad \text{Equation 4}$$

and thus $$H_c = \frac{H_m}{H_a} \qquad \text{Equation 5}$$

Therefore, one method of determining the scope channel response is to take a known stimulus with frequency content $H_s$, apply it to the input of the DSO channel, acquire it with the digitizer and acquisition system, measure its frequency content $H_m$ and use Equation 5 to determine the channel frequency response $H_c$.

The resp 69 and corr 70 input pins are polymorphic, meaning they show the same interface, but their behavior differs based on the input. Namely, each input pin is capable of accepting either a time-domain or frequency-domain waveform. Thus the system can receive channel frequency response specifications in the following four formats:

| What is known about | Reference Format | |
|---|---|---|
| reference | Time-domain waveform | Frequency sweep |
| Time-domain response | D | A |
| Frequency content | C | B |

A: Frequency sweep is provided with known time domain response.

This combination is almost never used, since the time domain response of a swept sinusoid is rarely known.

B: Frequency sweep is provided with known frequency response

This combination is probably the most common. Accurate instruments that deliver radio frequency (RF) sinusoids are easy to find (for example, the HP8648B 2 GHz signal generator manufactured by Hewlett Packard). Furthermore, the frequency content of the actual sinusoid delivered to the DSO is easy to measure using an RF power meter or sufficiently accurate spectrum analyzer. Also, a network analyzer can be utilized to measure the frequency response characteristic of any cables used to deliver the sinusoid. One of the drawbacks of this combination is that is takes a long time to sweep the sinusoid since each frequency of interest must be delivered to the DSO and a measurement must be made of the amplitude and phase of the signal at each frequency point. Another drawback is that it is difficult to accurately know the phase of the sinusoid. Sometimes, this difficulty can be overcome using special trigger outputs from the generator.

C: Time domain waveform is provided with known frequency response

This is another common combination. The main requirement for a source using this combination is that it has sufficient power at the frequencies of interest. Two common inputs are step and impulse functions. While perfect steps and impulses cannot be generated easily, it is possible to know the frequency content of the waveform. The easiest manner is to first calibrate the generator by acquiring the time-domain waveform with a DSO and then measure the frequency response of the channel using the method disclosed in combination B. The frequency content of the time-domain source waveform is easily calculated as the measured response from the frequency sweeps minus the frequency content of the sweep generator plus the measured frequency response of the time-domain source waveform. The measured frequency response of the time-domain source waveform is easily calculated using a Fast Fourier Transform (FFT) or Chirp Z Transform (CZT).

While calibration of the time-domain generator suffers from the same drawbacks as described in combination B, this calibration does not need to be performed as frequently (only often enough for the calibration of the time-domain source to remain valid). This combination also suffers from the additional drawback that it is difficult to generate time-domain waveforms whose frequency content does not vary with amplitude. Since the DSO frequency response will vary over its various gain ranges, it is desirable to have a source that can be easily used at any possible gain setting. The strength of this method is the speed and ease with which the measurement is made. All that is needed is to input the calibrated time-domain waveform, trigger on the waveform, and average enough acquisitions to sufficiently reduce the noise. This process can often be performed in under a second.

D: Time domain waveform is provided with known time domain response

This combination is not often used. It has the same benefits as combination C, in that once calibrated the measurement of the time domain waveform can be performed quickly. The problem is that the actual time domain performance of the source usually cannot be determined directly. In other words, it would be inferred from a frequency response measurement. Note that this combination could be used if a DSO using the present invention were used in the calibration of the time-domain source.

The type of waveform attached to the resp 69 and corr 70 inputs is determined by examining its waveform descriptor. The time domain waveforms are converted to frequency responses using the standard Chirp-Z transform (CZT). See M. T. Jong, Methods of Discrete Signal And Systems Analysis, McGraw-Hill Inc., 1982, pp. 297–301, the entire contents thereof being incorporated herein by reference. The CZT is used because it allows precise setting of the number of frequency points in the response, regardless of the sampling rate. Many advanced Fast Fourier Transform (FFT) algorithms also provide this capability, but the CZT is simple and only requires a radix 2 FFT regardless of the number of points in the input signal. While the number of frequency points is settable in the filter builder, 50 points (from 0 Hz to the maximum compensation frequency) works well. The maximum compensation frequency is the frequency at which we will no longer try to undo the effects of the channel frequency response. Usually, this is the frequency at which the magnitude response of the channel approaches the noise floor. This frequency is usually the maximum attainable bandwidth of the instrument using this invention.

Although there are a fixed number of points (from 0 to the maximum compensation frequency), the CZT is sometimes calculated out to the Nyquist limit. It is sometimes useful to view the performance of the compensation portion beyond the frequencies of interest.

Once the waveform at the input to the resp 69 and corr 70 inputs have been converted to frequency responses, $H_s$ and $H_m$ have been determined. Generally the frequency response is represented as a magnitude (in decibels) and a phase (in degrees). If necessary, the responses are resampled using C-spline interpolation. At this point, $H_c$ is calculated by subtracting the magnitude and the phase. $H_c$ forms the basis for the design of the compensation filter portion.

An example of a calculated $H_c$ is shown in FIG. 5. The source waveform used to determine $H_m$ is a step 80 provided by a step generator. This step has been acquired by a DSO channel. To reduce noise and increase resolution (both horizontally and vertically), the acquired step is averaged repeatedly by the DSO. The impulse response of a perfect step is:

$$\delta(t) = \frac{d}{dt}u(t) \qquad \text{Equation 6}$$

and thus the frequency content is:

$$D(s) = \frac{1}{s}U(s) \qquad \text{Equation 7}$$

The frequency content of the step ($H_s$) can easily be determined by taking the derivative of the step acquired through a channel with a flat frequency response and applying the CZT. FIG. 5 shows the result of the application of Equation 5. Descriptive box 82 shows that the step 80 is about 250 mV in amplitude, and that the duration of this waveform is 20 ns. The measured frequency response 81 of the channel is plotted at 0.5 GHz per horizontal division and 1 dB per vertical division, as indicated in box 83. As shown, this channel frequency response is not flat.

The compensation filter portion is designed based on this channel response to counteract the deviation of the response from 0 dB—in effect, the filter provides the exact inverse of the channel response. An analog filter is first designed that emulates the channel response as closely as possible, the filter is inverted to provide the inverse response, and then converted to a digital filter using a bilinear transformation. The bilinear transformation is well known to those skilled in the art of digital signal processing, but some of the details are described below.

The bilinear transformation is used to convert analog filters to digital filters through a direct substitution of the Laplace variable s. Take an analog filter transfer function:

$$H(s) = \frac{\sum_{n=0}^{N} a_n \cdot s^n}{\sum_{m=0}^{M} b_m \cdot s^m} \qquad \text{Equation 8}$$

perform the following substitution:

$$s \rightarrow 2 \cdot f_s \cdot \frac{1 - z^{-1}}{1 + z^{-1}} \qquad \text{Equation 9}$$

And algebraically manipulate the resulting equation to put it in the following form:

$$H(z) = \frac{\sum_{n=0}^{N} A_n \cdot z^{-n}}{\sum_{n=0}^{M} B_m \cdot z^{-m}} \qquad \text{Eqaution 10}$$

By performing this substitution, a digital filter according to Equation 10 will not perform exactly as the analog filter of Equation 8. This is because the substitution shown in Equation 9 creates a non-linear relationship between the frequency response of the analog and digital filters. This non-linear relationship is called warping. Specifically, this relationship is:

$$f_d = \frac{F_k}{\pi} \cdot \tan^{-1}\left(f_a \cdot \frac{\pi}{F_a}\right) \qquad \text{Eqaution 11}$$

where $f_d$ is the frequency where the digital frequency response is evaluated, $f_a$ is the frequency where the analog frequency response evaluated, and $F_s$ is the sampling rate of the digital system. In other words, using this transformation, the analog filter response evaluated at $f_a$ equals the digital filter response evaluated at $f_d$. Note that:

$$x = \tan^{-1}(x) \text{ for small values of x.} \qquad \text{Equation 12}$$

Therefore, $f_a = f_d$ for small values of $f_a$ with respect to $F_s$. In other words, the performance of the digital filter matches the performance of the analog filter for low frequencies with respect to the sample rate. For this reason, filters designed using the bilinear transform are sometimes able to ignore the warping effect. However, in the DSO, the bandwidth may be exactly at the Nyquist rate. Hence, the effects of warping cannot be ignored.

To account for warping, the channel frequency response is prewarped. FIG. 6 shows the prewarped response 201. Prewarping involves changing the frequency scale of the channel frequency response 200. Each frequency is replaced with a new value to counteract the warping:

$$f \rightarrow \frac{f_a}{\pi} \cdot \tan\left(\pi \cdot \frac{f}{f_a}\right) \qquad \text{Equation 13}$$

Note that Equation 13 tends toward infinity as f approaches the Nyquist rate. Even excluding the Nyquist rate, frequencies close to Nyquist still generate large prewarped frequencies. For this reason, the size of the prewarped frequencies are restricted to a fixed multiplicative factor (e.g. 50). Any prewarped response points above fifty times the Nyquist rate are discarded.

An analog filter, having the form of Equation 8, matching the prewarped response is built. As seen from the prewarped response 201 shown in FIG. 6, the prewarping effects tend towards infinity at Nyquist. This means that even though the frequency response of the channel tends to have a steep drop as the bandwidth of the channel is exceeded, the prewarped magnitude response flattens asymptotically, approaching a fixed attenuation (i.e. the prewarped response approximates a horizontal line as the response tends towards infinity). This means that a logical estimation of the analog filter structure is one having an equal number of poles and zeros. For this reason, N=M in the analog filter structure shown in Equation 8.

The filter is built by deciding on the value of N (the number of filter coefficients in the numerator and denominator polynomial) and making an initial guess at the numerator and denominator coefficients $a_n$ and $b_m$. Then, these coefficients are iteratively adjusted until the mean-squared error between the magnitude response of the filter and the prewarped channel frequency response specified is minimized. It is important that the initial guess of the coefficient values be reasonable. If not, the L2 minimization may not converge, or may converge to a local minimum instead of the absolute minimum. If the local minimum is far away from the absolute minimum, the resulting filter design may be useless. Generally, a reasonable guess would be any guess that has no overlapping poles and zeros, or whose frequency response is close to the channel frequency response.

An appropriate guess is designed by imagining a filter design that is basically flat, within the constraints that the filter has N coefficients. From Bode plot approximations, a single, real pole or zero has a 3 dB effect at the pole location. In other words, a pole at $s = j \cdot \omega_p$ will provide attenuation of 3 dB at $f = \omega_p / 2 \cdot \pi$. Further, a pole creates a knee in the response at the 3 dB point. The response is basically flat before this knee, and rolls off at 6 dB per octave after the knee. There is a correction to this approximation of about 1.0 dB downward an octave in either direction. Since poles and zeros work to cancel each other, the 6 dB/octave roll-off created by a pole is cancelled by a zero that is higher in frequency. In other words, a pole followed by a zero will create a response that is basically level out to the pole, dropping at 6 dB/octave after the pole and being basically level at and beyond the frequency of the zero. Thus, if a sequence of poles and zeros is provided in a certain manner, it is possible to build a basically flat response. The sequence would be either: pole, zero, zero, pole, pole, zero . . . ; or zero, pole, pole, zero, zero, pole . . . .

By examining the Bode approximation, these poles and zeros should be spaced an octave apart out to the maximum frequency of compensation for ideal flatness. Since for high order systems this might cause undo compression of multiple poles below the first frequency response point in the channel frequency response, a multiplicative factor—as opposed to exact octave spacing—can be used.

This factor may be calculated as follows: The end frequency ($f_{end}$) is defined as the last frequency point in the prewarped channel frequency response. The start frequency ($f_{start}$) is defined to be somewhat higher than 0 Hz (e.g. the $8^{th}$ frequency point in the prewarped channel response). The multiplicative factor ($M_{space}$) that would fit alternating poles and zeros ideally between these frequencies is:

$$M_{space} = \left(\frac{f_{end}}{f_{start}}\right)^{\frac{1}{(2\cdot N-1)}} \qquad \text{Equation 14}$$

$M_{space}$ is 2.0 for exact octave spacing.

With this in mind, an array of frequencies is generated, and the poles and zeros are placed at these frequencies in one of the two sequences stated earlier. The array of frequencies is described by:

$$n\epsilon 0 \ldots 2\cdot N-1 \; f_n = f_{start}\cdot(M_{space})^n \qquad \text{Equation 15}$$

Once the poles and zeros are known, the numerator and denominator polynomials having the form of Equation 8 are calculated by polynomials multiplication.

Besides being essentially flat, this guess at the pole and zero locations has another characteristic that makes it a good initial starting point in the L2 minimization. Because all of the poles and zeros (except the first and the last) are adjacent along the negative real axis in the S-plane, they can easily pair together and move off as complex conjugate pairs during the fit of the filter to the channel response. Complex conjugate pairs of poles and zeros are very effective at resolving sharp ripples in the channel frequency response. Since complex poles and zeros must come in conjugate pairs, it is ideal to have them initially sitting next to one another on the real axis.

FIG. 7 shows the magnitude response of an initial filter guess with four poles and zeros. FIG. 7 shows the individual response of each pole 210 and zero 211, along with the overall magnitude response 212 formed by summing the individual contributions. All guesses will contain ripple and be slightly offset from 0 dB. FIG. 8 shows the pole and zero locations of the initial guess analog filter.

It is now necessary to adjust the coefficients of this initial filter guess to minimize the error between its response and the prewarped channel response. A statement of this problem is as follows:

Given a prewarped channel frequency response containing K coordinates where each coordinate is of the form ($\omega_k$, $h_k$). Respectively, $\omega_k$ and $h_k$ are the frequency in GHz and the magnitude response (unitless) of the $k^{th}$ data point. Find values $a_n$ and $b_m$ such that the mean squared error (mse) is minimized. In other words, we minimize:

$$mse = \frac{1}{K}\cdot\sum_k (|H(j\cdot\omega_k)| - h_k)^2 \qquad \text{Equation 16}$$

A (local) minimum is reached when the filter coefficients $a_n$ and $b_m$ are such that the partial derivatives of the mean-squared error with respect to all coefficients are zero when the filter magnitude response is evaluated at these coefficient values. This is done by finding the point at which the gradient is zero. This means that the partial derivative with respect to any coefficient is zero:

$$\frac{\partial}{\partial a_n} mse = 0 \text{ and } \frac{\partial}{\partial b_m} mse = 0$$

The evaluation of these partial derivatives leads to:

$$\frac{\partial}{\partial a_n} mse = \frac{2}{K}\cdot\sum_k (|H(j\cdot\omega_k)| - h_k)\cdot\frac{\partial}{\partial a_n}|H(j\cdot\omega_k)| \qquad \text{Equation 17}$$

$$\frac{\partial}{\partial b_m} mse = \frac{2}{K}\cdot\sum_k (|H(j\cdot\omega_k)| - h_k)\cdot\frac{\partial}{\partial b_m}|H(j\cdot\omega_k)| \qquad \text{Equation 18}$$

Equation 17 and Equation 18 demonstrate that to evaluate the partial derivatives of the mean-squared error, we require analytical functions for the magnitude response and the partial derivatives with respect to the magnitude response only. In fact, most non-linear equation solvers require exactly that. The magnitude response can be evaluated as:

$$|H(\omega)| = \sqrt{\frac{(\alpha(\omega))^2 + (\beta(\omega))^2}{(\gamma(\omega))^2 + (\delta(\omega))^2}} \qquad \text{Equation 19}$$

where:

$$\alpha(\omega) = \sum_{i=0}^{floor\left(\frac{N-1}{2}\right)} \alpha_{2\cdot r}\cdot\omega^{2\cdot r}\cdot(-1)^r \qquad \text{Equation 20}$$

$$\beta(\omega) = \sum_{i=0}^{floor\left(\frac{N}{2}\right)-1} \alpha_{2\cdot i+1}\cdot\omega^{2\cdot i+1}\cdot(-1)^i \qquad \text{Equation 21}$$

$$\gamma(\omega) = \sum_{i=0}^{floor\left(\frac{M-1}{2}\right)} b_{2\cdot r}\cdot\omega^{2\cdot r}\cdot(-1)^r \qquad \text{Equation 22}$$

$$\delta(\omega) = \sum_{i=0}^{floor\left(\frac{M}{2}\right)} b_{2\cdot i+1}\cdot\omega^{2\cdot i+1}\cdot(-1)^i \qquad \text{Equation 23}$$

The partial derivative of the magnitude response with respect to each numerator coefficient is:

$$\frac{\partial}{\partial a_n}|H(\omega)| = \frac{1}{2\cdot|H(\omega)|}\cdot\frac{(\gamma^2+\delta^2)\cdot\left(2\cdot\alpha\cdot\frac{\partial}{\partial a_n}\alpha + 2\cdot\beta\cdot\frac{\partial}{\partial a_n}\beta\right) - (\alpha^2+\beta^2)\cdot\left(2\cdot\gamma\cdot\frac{\partial}{\partial a_n}\gamma + 2\cdot\delta\cdot\frac{\partial}{\partial a_n}\delta\right)}{(\gamma^2+\delta^2)^2} \text{ or:} \qquad \text{Equation 24}$$

$$\frac{\partial}{\partial a_n}|H(\omega)| = \frac{1}{|H(\omega)|\cdot(\gamma(\omega)^2+\delta(\omega)^2)}\cdot\begin{cases}\alpha(\omega)\cdot\left[\omega^n\cdot(-1)^{\frac{n}{2}}\right] & \text{if even}(n)\\ \beta(\omega)\cdot\left[\omega^n\cdot(-1)^{\frac{n-1}{2}}\right] & \text{if odd}(n)\end{cases} \qquad \text{Equation 25}$$

The partial derivative of the magnitude response with respect to each denominator coefficient is:

$$\frac{\partial}{\partial b_m}|H(\omega)| = \frac{1}{2\cdot|H(\omega)|}\cdot\frac{(\gamma^2+\delta^2)\cdot\left(2\cdot\alpha\cdot\frac{\partial}{\partial b_m}\alpha+2\cdot\beta\cdot\frac{\partial}{\partial b_m}\beta\right)-(\alpha^2+\beta^2)\cdot\left(2\cdot\gamma\cdot\frac{\partial}{\partial b_m}\gamma+2\cdot\delta\cdot\frac{\partial}{\partial b_m}\delta\right)}{(\gamma^2+\delta^2)^2} \quad \text{Equation 26}$$

$$\frac{\partial}{\partial b_m}|H(\omega)| := \frac{-(\alpha(\omega)^2+\beta(\omega)^2)}{H(\omega)|\cdot(\gamma(\omega)^2+\delta(\omega)^2)}\cdot\begin{cases}\gamma(\omega)\cdot\left[\omega^m\cdot(-1)^{\frac{m}{2}}\right] & \text{if even}(m)\\ \left[\delta(\omega)\cdot\left[\omega^m\cdot(-1)^{\frac{m-1}{2}}\right]\right] & \text{if odd}(m)\end{cases} \quad \text{Equation 27}$$

At this point, knowing Equation 19, Equation 25, and Equation 27, the filter can be adequately solved using any reasonable non-linear equation solver (e.g. the genfit function within MathCAD or the Levenberg-Marquardt algorithm).

Note that when solving this equation, the partial derivative with respect to coefficient $b_0$ should not use Equation 27, but should instead be set to infinity (or a huge number). This is because the actual values $a_0$ and $b_0$ are arbitrary. The ratio of $a_0$ and $b_0$ is all that is important—this ratio sets the dc gain of the system. If one of these coefficients is not fixed, then both may grow very large or very small. By setting the partial derivative of $b_0$ to infinity, the equation solver will not significantly modify this parameter, and $a_0$ will remain unconstrained to set the ratio of $a_0$ to $b_0$.

Knowing the magnitude response function and the partial derivatives, along with an initial guess at the starting filter coefficients, the Levenberg-Marquardt algorithm is run repeatedly. See Nadim Khalil, VLSI Characterization with Technology Computer-Aided Design—PhD Thesis, Technische Universität Wien, 1995, the entire contents thereof being incorporated herein by reference. For each iteration, the coefficients are adjusted to reduce the mean-squared error. Levenberg-Marquardt is a balance between two common least-squares minimization methods: the methods of steepest decent, in which the small steps are made along the gradient vector of the mean-squared error at each iteration. The method of steepest decent is very slow, but guaranteed to converge to a local minimum. The other method is Newton-Gauss. Newton-Gauss convergence is very fast but can diverge. Levenberg-Marquardt measures its own performance on each iteration. Successful iterations cause it to favor Newton-Gauss on subsequent iterations. Failed iterations cause it to favor steepest-decent on subsequent iterations. The method it is favoring depends on a value ($\lambda$).

TABLE 2

| Line | Math Step | Description |
|---|---|---|
| 1 | For k = 0 . . . K − 1 | for each response point |
| 2 | $R_k \leftarrow \lvert H(\omega_k, g_{i-1})\rvert - M_k$ | Calculate a residual |
| 3 | for j = 0 . . . 2N | For each response point and coefficient |
| 4 | $J_{k,j} \leftarrow \frac{\partial}{\partial g_j}\lvert H(\omega_k, g_{i-1})\rvert$ | Calculate and element of the Jacobian matrix as the partial derivative with respect to a coefficient evaluated a response point |

TABLE 2-continued

| Line | Math Step | Description |
|---|---|---|
| 5 | $H \leftarrow J^T \cdot W \cdot J$ | Calculate the approximate Hessian matrix |
| 6 | For j = 0 . . . 2N | Generate a matrix with only the diagonal elements of the Hessian matrix |
| 7 | $D_{i,j} \leftarrow H_{i,j}$ | |
| 8 | $\Delta P \leftarrow (H + \lambda \cdot D)^{-1} \cdot J^T \cdot W \cdot R$ | Calculate the delta to apply to the coefficients |
| 9 | $g_i \leftarrow g_{i-1} - \Delta P$ | Apply the delta to the coefficients |
| 10 | $mse_i \leftarrow \sum_k (\lvert H(\omega_k, g_{i-1})\rvert - M_k)^2$ | Calculate the new mean-squared error |
| 11 | if $mse_i > mse_{i-1}$ | If the mean-squared error increased, favor steepest decent, otherwise favor Newton-Gauss convergence |
| 12 | $\lambda \leftarrow \lambda \cdot 10$ | |
| 13 | | |
| 14 | else | |
| | $\lambda \leftarrow \frac{\lambda}{10}$ | |

Table 2 steps through an iteration of the Levenberg-Marquardt algorithm, where g is a vector of coefficients such that:

$$n \epsilon 0 \ldots N$$
$$g_n = a_n$$
$$g_{n+N+1} = b_n \quad \text{Equation 28}$$

The mean-squared error $mse_0$ is initialized to a value between the initial guess filter response and the prewarped channel response and $\lambda$ is initialized to 1000. Iteration of this method is complete when one of the following conditions occurs:

1. A specified mse is reached;
2. $\lambda$ reaches a maximum value (e.g. 1e10). Sometimes this indicates a divergence, but may also indicate a convergence;
3. $\lambda$ reaches a minimum value (e.g. 1e−10) indicating the system has converged.
4. At the convergence point, $\lambda$ may oscillate between two or three values;
5. At the convergence point, mse changes very slowly; or
6. A maximum number of iterations is exceeded. A maximum is set to prevent iterating indefinitely.

Once a local minimum has been reached, examination of the mean-squared error tests the performance of the minimization. If it is not low enough, the coefficients are randomly agitated to shake the system out of the local minimum and iteration continues with the hopes of converging on the absolute minimum.

At this point, both the numerator and denominator polynomial coefficients have been found for an analog filter, as described by Equation 8. This analog filter approximates the prewarped channel frequency response. The numerator and denominator are then swapped to form an analog filter that compensates the channel response.

The roots of each polynomial are found using a combination of LaGuerre's Method, followed by Bairstow's Method to refine the complex roots found by LaGuerre. See William H. Press et al., Numerical Recipes in C: the Art of Scientific Computing—2$^{nd}$ Edition, Cambridge University Press, 1992, pp. 369–379, the entire contents thereof being incorporated herein by reference. The refinement consists of an assumption that complex roots must come in conjugate pairs if the polynomial is real, which they are. This reference is necessary if high order polynomials are utilized.

Once the roots are found, the complex conjugate pairs are joined and the analog filter is re-formed as:

$$H(s) = \prod_n \frac{a_{0,n} + a_{1,n} \cdot s + a_{2,n} \cdot s^2}{b_{0,n} + a_{1,n} \cdot s + a_{2,n} \cdot s^2} \quad \text{Equation 29}$$

where st is the filter section. The filter is now in the form of biquad sections. The number of sections is the smallest integer greater than or equal to half the original numerator or denominator polynomial.

The filter can now be converted into a digital filter. A bilinear transformation is used to perform this conversion. Each section of the filter is the form:

$$H(s) = \frac{\sum_{n=0}^{2} a_n \cdot s^n}{\sum_{n=0}^{2} b_n \cdot s^n} \quad \text{Equation 30}$$

To convert the filter, we make the substitution in s as shown in Equation 9. The substitution is not made algebraically, but instead using the Bilinear Coefficient Formula. See Peter J. Pupalaikis, Bilinear Transform Made Easy, ICSPAT 2000 Proceedings, CMP Publications, Inc., 2000, the entire contents thereof being incorporated herein by reference. Each coefficient of each stage of the filter section shown in Equation 30 is converted to a digital filter section:

$$H(z) = \frac{\sum_{n=0}^{2} A_n \cdot z^{-n}}{\sum_{n=0}^{2} B_n \cdot z^{-n}} \text{ using:} \quad \text{Equation 31}$$

$$BF(l, n, N) = 2^i \cdot \sum_{k=\max(n-N+i,0)}^{\min(i,n)} \frac{i! \cdot (N-1)!}{k!(l-k)! \cdot (n-k)! \cdot (N-i-n+k)!} \cdot (-1)^k \text{ and} \quad \text{Equation 32}$$

$$A_n = \sum_{i=0}^{N} a_i \cdot F_s^i \cdot BF(i, n, N) \quad B_n = \sum_{i=0}^{N} b_i \cdot F_s^i \cdot BF(i, n, N) \quad \text{Equation 33}$$

For biquad sections, N=2 and all coefficients are divided by $B_0$, so that $B_0$ becomes 1.0 with no change in performance. At this point, the compensation portion of the filter element has been computed.

The magnitude response of this filter is evaluated at the frequency points used to match the channel frequency response (the points prior to prewarping), and the waveform representing this response is output through the comp output 76 of the filter builder 56 and on to the comp output pin 72 shown in the FIG. 4. In this manner, the DSO user can examine the compensation filter performance.

FIG. 9 shows the fit between the response of compensation filters built with varying compliance and a channel frequency response. FIG. 10 shows this fit in the 0–2 GHz region. For this particular channel, 2 GHz is the maximum frequency to which compliance is enforced. This is a reasonable limitation since the channel response is attenuated by about 9 dB at 2 GHz.

FIG. 11 shows the magnitude response of the compensation filter designed to compensate the channel. The response is shown for varying degrees of compliance. FIG. 12 again shows the response in the 0–2 GHz region. Note that the compensation filters in FIG. 12 counteract the channel frequency response. Furthermore, the flatness of the resulting response improves with increasing compliance. Remember, the degree of compliance translates into a user specification of the degree of the filter (i.e. the number of biquad sections in the filter). Examining FIG. 12, it is difficult to clearly see the amount of improvement in the compensation as the compliance increases. Therefore, FIG. 13 is provided to shown the absolute error from 0 dB of the overall, compensated system with varying degrees of compensation filter compliance specified.

Since higher degrees of compliance result in more biquad sections in the compensation filter, FIG. 14 shows the compensation filter performance as a function of the number of stages in the filter. For this particular channel, the maximum error is about 9 dB out to 2 GHz, without compensation. The average error is just over 1 dB. With only two filter sections for compensation (i.e. low compliance), the channel can be flattened to a maximum error of less than 0.5 dB, and an average error of only 0.2 dB. With maximum compliance (i.e. 8 filter sections), the maximum error is reduced to less than 0.1 dB, with the average error being less than 0.04 dB. Thus, the degree of compliance can be used to reduce the maximum error (in dB) by two orders of magnitude, and the average error by a factor of 25.

The design of the arbitrary response portion of the filter is now described. FIG. 15 shows a simple user interface that includes only a control over the final response 84. This user interface allows the user to finely specify the bandwidth 85. Current DSOs generally provide a choice of only two or three fixed bandwidth settings. Additionally, this user interface allows the user to choose between four optimizations (nothing 87, pulse response 88, noise performance 89, and flatness 90) in the response optimization area 86. Depending on the options present within the scope, there may be an additional response specification labeled "special" that allows the user to select from a menu of other possible responses, such as the single-pole of critically damped double-pole responses. Other possible responses could be custom tailored for particular tests. Specifically, the responses specified by various standard measurements (e.g. IEEE and ANSI defined standards). The choice of nothing 87 for the response optimization, turns off both the compensation filter portion and the response generator portion.

The advanced setting tab 91 leads to another dialog box as shown in FIG. 16. Note that an additional control has been added under response optimization called Favor 92. A choice is provided to favor noise performance 93 or the optimization specified 94. This choice will be explained when the details of the response filter design are discussed below. Control is also provided for compensation 95. This includes the degree of compliance 96 that determines the number of biquad sections in the compensation filter portion. Also, the maximum compensation frequency 97 can be set to specify the frequency up to the desired compliance. Control over the final digital filter implementation 98 may also be provided. Two choices, IIR 99 and FIR 100, are shown. Another possible choice is a default setting (i.e. Auto, which automatically chooses the faster of the IIR or FIR filter for final implementation). Tests showed that insofar as the update rate, the IIR filter invariably outperformed the FIR filter. Also, the IIR filter length does not vary with the sample rate (as does the FIR). Therefore, for purposes of this application, the IIR filter is the preferred filter, but the user may choose the FIR filter if desired. Since the FIR is the truncated impulse response of an IIR, the filter settling amount 101 must be specified (e.g. 10e-6). The filter settling value defines the sample point in the impulse response beyond which the impulse response can be neglected. The filter settling samples 102 is a value calculated based on the specified filter setting value. For FIR implementations, it is the number of filter taps. In both the FIR and IIR implementations, it is the number of points that must appear off-screen to the left of the displayed waveform to allow for filter startup.

Recall that the generated responses consist of two portion—the desired response and the noise reducer. The noise reducer must be included not only for the elimination of noise, but also to protect against overboost in the compensation filter beyond the maximum compensation frequency ($f_{mc}$). This is because the compensation filter is basically unconstrained outside the compensation frequencies. As seen in FIG. 11 and FIG. 12, beyond the compensation frequencies, the filters tend to behave wildly. The noise reducer is governed by an attenuation setting ($A_s$) and a frequency setting ($f_s$) where $f_s$ is calculated as a multiplicative factor ($M_{mcf}$) of $f_{mc}$. In other words, when building the filter, some attenuation is needed at frequencies higher than $f_{mc}$ to protect against wild behavior from the compensation filter.

Five possible response optimizations are now discussed, in order of complexity from lowest to highest. The trivial case is no optimization, which simply leaves this portion out of the final filter and disables the compensation portion.

Flatness optimization involves the design of a Butterworth filter as the response portion. The intent of the Butterworth filter is to supply some noise reduction (and overboost protection for the compensation filter) while affecting the pass-band as little as possible. The design is that of a traditional Butterworth filter with the pass-band and stop-band edges being specified ($f_p$ and $f_s$), along with the maximum pass-band attenuation ($A_p$) and the minimum stop-band attenuation ($A_s$). See T. W. Parks, Digital Filter Design, John Wiley & Sons, Inc., 1987, pp. 159–205, the entire contents thereof being incorporated herein by reference. The resulting Butterworth filter has a calculated order $O_{butter}$. This order may be clipped, if necessary, to the specified largest order allowed $O_{buttermax}$. If the filter is clipped to $O_{buttermax}$ the filter will not meet both the pass-band and stop-band specifications. In this case, the Butterworth filter is situated to provide the exact attenuation $A_s$ at $f_s$. Hence, the attenuation at $f_p$ will be greater than $A_p$, thus the flatness specification is violated. If the filter order is not clipped, then the filter will meet, or exceed the specifications. This is because the filter order is chosen as the smallest integer that satisfies the specifications. In this case, the user specifies a bias towards which specifications should be exceeded in the favor specification 92. If the user favors noise performance 93, the Butterworth filter represents the traditional design providing the exact attenuation $A_p$ at $f_p$ and generally providing better attenuation than $A_s$ at $f_s$. If the response optimization 94 is favored, the Butterworth is situated to provide the exact attenuation $A_s$ at $f_s$. In this case, the attenuation at $f_p$ will be less than or equal to $A_p$ and the filter will generally outperform the flatness specification.

The specifications for the flatness response are derived from the user specifications: $f_p$ is set to the specified bandwidth frequency ($f_{bw}$) even though it is not actually the bandwidth, $A_p$ is taken from the specification of δ (deviation), and $A_s$ is a default value based on the hardware behavior of the particular scope channel. The value of δ is generally chosen based on the typical compensation filter performance. In other words, if the compensation filter can provide at best 0.1 dB of compliance, then a δ less than 0.1 is probably an unnecessary constraint. The value $f_s$ is calculated as $M_{mcf}$ times $f_{mc}$ unless overridden, where $M_{mcf}$ has a default value based on the particular scope channel (e.g. 1.667).

The noise performance response optimization is similar to the flatness response optimization, except that $A_p$ is set to the specified attenuation ($A_{bw}$) at the bandwidth frequency ($f_{bw}$). Note that $A_{bw}$ defaults to 3 dB, but downward modification is allowed to guarantee the bandwidth. $A_s$ and $f_s$ are ignored and the Butterworth filter is designed as the highest order Butterworth filter allowed ($O_{buttermax}$) having attenuation $A_{bw}$ at $f_{bw}$. This provides the absolute maximum amount of attenuation for a given bandwidth. The specifications for the noise performance response are derived from the user specifications: $f_p$ is taken from the bandwidth specification ($f_{bw}$), and $f_s$ is calculated as $M_{mcf}$ times $f_{mc}$ unless overridden.

When pulse response optimization is specified, a Besselworth filter is designed to optimize the response characteristics. This filter has a combination of Bessel and Butterworth response characteristics. The Bessel filter has a linear phase response characteristic and a very slow roll-off. Most importantly, it is the low-pass filter with the best pulse response characteristics. The Butterworth filter has the sharpest roll-off, given a flat pass-band and stop-band response. The Besselworth filter is specified as follows:

1. The Bessel order is specified as $O_{bessel}$;
2. The maximum possible Butterworth order is specified as $O_{buttermax}$;
3. It must have no more than $A_{bw}$ attenuation at $f_{bw}$;
4. It must deviate from a Bessel response by no more than δ before the Bessel response drops below $A_\delta$ dB of attenuation, or alternately specified, at a frequency of $f_\delta$; and
5. It must have at least $A_s$ attenuation at and beyond $f_s$.

$A_{bw}$ and $f_{bw}$ are the bandwidth specifications. δ is the deviation as described earlier. The default value of $A_\delta$ is unspecified, and overridden by a direct statement of $f_\delta$, which defaults to the maximum compensation frequency $f_{mc}$. In other words, the default setting is for the response to closely comply with a Bessel response for the entire frequency range for which compensation is provided $A_s$ and $f_s$ have been explained previously.

FIG. 17 shows a flowchart of the Besselworth design procedure. An analog Bessel filter is designed in step 103. See Lawrence R. Rabiner and Bernard Gold, Theory and Application of Digital Signal Processing, Bell Telephone Laboratories, 1975, pp 228–230, the entire contents thereof being incorporated herein by reference. The Bessel filter is designed to a specification with frequencies that are not prewarped. Once the Bessel filter is designed, the frequency $f_\delta$ at which the attenuation reaches $A_\delta$ is calculated from the magnitude response 105, unless $f_\delta$ is explicitly specified 104. The Butterworth order calculation 106 is self explanatory and can be calculated directly or through trial or error. Note that the Bessel attenuation has been subtracted from the attenuation requirement for the Butterworth. Note also that the Butterworth order must be determined using prewarped specifications. If the order is too large 107, it is set to its maximum value 108. At this point, the favor specification is utilized 109 in the same manner as described for the flatness optimization and one of the two Butterworth filter designs (110 and 111) is chosen. Once this filter is designed, the effect of the Butterworth at $f_{bw}$ 112 is calculated and the Bessel filter is rescaled (in frequency) to account for the attenuation of the Butterworth filter 113. Note that $f_\delta$ and $f_s$ tend to be far from $f_{bw}$ and the Butterworth filter's relatively sharp roll-off generally makes its effects at $f_{bw}$ small. This means that the Bessel filter only needs to be adjusted slightly in step 113. Furthermore, resealing moves the Bessel to provide less attenuation at $f_c$ and $f_\delta$, but the attenuation at $f_s$ is also lessened which jeopardizes the filter's ability to meet the stop-band attenuation specification. Since the Bessel filter has a slow roll-off, this effect is usually negligible. One method of compensating for this is to add one to the order calculated in 106, when noise performance is being favored. Another problem is that the Butterworth filter may have such a large effect at $f_c$ that it is impossible to meet the bandwidth specification, even with a high-order Butterworth. This occurs when the bandwidth is specified at or near the Nyquist rate. This problem can be detected by comparing $A_{butter}$ calculated in 112 to $A_{bw}$. If $A_{butter}$ is greater, no Bessel filter will meet the specification (because it would be required to provide a gain). In this case, the Butterworth filter is discarded, and the system only uses the Bessel filter. In this instance, the bandwidth specification is effectively being chosen as a higher priority than the stop-band attenuation specification. Once the Butterworth and Bessel filters are designed, the Bessel filter response is plotted (prewarped), and an analog filter is fitted to this response 114 (in much the same way the compensation filter is calculated by fitting it to the channel response). The analog filter has an equal number of zeros added to the numerator as the analog Bessel filter has poles. Both filters are converted to digital filters 115 using the bilinear transformation. The digital Butterworth filter exhibits warping, but this warping was accounted for in its design. The Bessel filter, because of the fit, exactly matches the analog Bessel response out to the Nyquist rate. This method provides the exact response characteristics for the Bessel filter portion.

FIG. 18 shows an example of such a Besselworth filter 300. The filter in FIG. 18 is for a system with a bandwidth specification of 2 GHz ($f_{bw}$). It has been conservatively specified as 2.5 dB attenuation ($A_{bw}$) at the bandwidth frequency. It is further specified to deviate no more than 0.5 dB (δ) up to the point at which the second order ($O_{besset}$=2) Bessel magnitude response 301 attenuates by 6 dB ($A_\delta$). Since $f_\delta$ was not specified, it was calculated—the frequency at which the Bessel response reaches—6 dB is 3.178 GHz (which leads to a prewarped specification of 7.608 GHz). It was found that a $5^{th}$ order ($O_{butter}$=5) Butterworth filter 302 was capable of providing a system attenuation of 20 dB ($A_s$) at the calculated stop-band edge of 3.501 GHz. The filter in FIG. 18 meets these specifications.

Special responses—like single-pole, double-pole, critically damped, and other industry standards—are generated exactly as in the procedure outlined in FIG. 17, with the special response substituted for the Bessel filter. In addition, an inverse-Chebyshev filter is also a suitable replacement for the Butterworth filter, since ripple in the stop-band can certainly be tolerated in favor of sharper cut-off.

Regardless of the response filters generated, they are converted to digital filters and are retained internally as two stages (the noise reducer and the shaper). The frequency response of each is output on the noise 74 and shape 73 pins of the component shown in FIG. 4. In all response optimization cases, the Butterworth filter represents the noise reducer portion. In the case of pulse response optimization, the Bessel portion of the Besselworth filter design represents the shape portion. In the case of special responses, these responses represent the shape portion. In the case of flatness and noise performance optimizations, there is no shape filter portion and a frequency response indicating unity gain at all frequencies is output on the shape pin 73.

To filter data, the system cascades the shaper and noise reducer digital filters to form the arbitrary response generation filter portion. The system then cascades the compensation filter portion and arbitrary response generation filter portion to form the entire compensation and response generation system. The filter coefficients are output from the filter builder 56 coef output pin 65 shown in FIG. 4, where they can be used by the IIR 54 or FIR 55 filter.

In summary, the interfaces to the component shown in FIG. 4 are as follows:

1. The input/output of the internal filtering element;
2. The specifications of the desired output response;
3. The specification of the channel frequency response; and
4. The output of the pins that describe the compensation and response that is provided by the internal filtering element after the filters have been determined by the filter builder component.

Calibration of a system utilizing the component shown in FIG. 4 simply involves providing the channel frequency response. FIG. 19 shows an arrangement used for calibration of a DSO 116 having a probe 117 for probing a circuit under test 118. The probe 117 is connected to a channel input 119 of the DSO 116. The signal enters the channel 120 and is digitized by the ADC, after which signals are processed and displayed by the internal computer 121. A calibrated reference generator 122 is shown internal to the DSO 116. The calibrated reference generator 122 consists of a signal source 123 and calibration information 124. The reference source 122 generates a signal whose frequency content is known well. The known frequency content is stored internally as calibration data 124. The reference calibration data 124 along with the reference signal generator 123 form a calibrated reference 122. Under specified conditions, such as changes to scope settings, changing temperature, elapsed time, or explicitly at the users request, a calibration may be performed by switching out the test signal at internal input selector 125, switching in the reference generator connection 126, controlling the reference generator 123 and acquiring data from this generator by digitizing the reference generator waveform that enters the channel 120. The internal computer 121 processes the data acquisitions, thereby generating measured frequency response data. The measured frequency response data, along with the known frequency response 124 from the calibrated reference generator 122, is passed on to the processing element that is the subject of this invention in order to determine the channel frequency response.

This calibration method calibrates the signal path through the channel 120 down to the switch 125, but also includes the path 126 to the reference generator 123. This means that the path 126 from the switch 125 to the reference generator 123 and the path 127 from the switch 125 to the scope input 119 must be designed very carefully, or its frequency response characteristics must be known. Furthermore, note that the probe 117 is out of the calibration loop. In effect, the calibration procedure explained calibrates the DSO to the scope input 119 only. While it is possible to design the internal paths of the scope (126 and 127) to high precision, this is not always possible with regard to the probe.

To account for this, many scope probes carry calibration information stored in an internal memory (EEPROM) that may be read by the internal computer when the probe is inserted. Calibrated probes carry frequency response information that can be used in the channel frequency response calculation. For example, if the frequency response of the probe is known, the internal computer can simply add this frequency response to the measured frequency response prior to sending the information to the filter-building component. The resulting compensation would then account for the frequency response of the probe.

Alternatively, the user may connect the probe 117 periodically to the reference signal output 128 and perform the calibration as described, except that the input selector switch 125 should remain in the normal operating position. The resulting calibration accounts for the frequency response from the probe tip 129 through the entire channel 120. While this type of calibration cannot be completely automated, it does provide the highest degree of compensation. Furthermore, if this type of calibration is the only calibration method provided, then there is no need for the input selector switch 125 and the internal path 126 to the reference generator.

Further, the calibrated reference generator 122 need not reside in the scope. It can be supplied externally and sold as an option to the DSO. In addition, the calibration data 124—while tied to the reference generator 123—need not be collocated. The data can reside on a disk for loading into the scope. However, there should be some method of identifying the reference generator 123 and corresponding calibration data 124. Depending on the type of generator used, no direct control of the generator by the internal computer may be necessary.

The filter builder calculates four responses: the channel response, and the three components of the filter response. The three components of the filter response are the compensation, shaper, and noise reducer responses. Using these response outputs, an all-encompassing frequency response specification can be delivered to the user by simply plotting any or all of the algebraic combinations of these responses and providing this information to the user. In this manner, the user can examine any frequency response behavior desired. In addition, plots like FIG. 13 are possible and may provide useful additional information. Further, various metrics (like the data shown in FIG. 14) may be calculated from these plots.

The ability to provide this type of scope performance data is important. For example, many standard measurements require certain measurement instrument specifications (e.g. a particular measurement might state that a scope must be used that is flat to within 0.5 dB out to 2 GHz). Not only does the invention provide the capability to satisfy such a requirement, but it also provides the ability to examine the final specifications to ensure compliance. Finally, the invention allows for recording and printout of the scope specifications along with the users measurements (as shown in FIG. 20), thus providing verification of proper measurement conditions.

While a preferred embodiment of the present invention has been described using specific terms, such description is for illustrative purposes only, and it is to be understood that changes and variations may be made without departing from the spirit or scope of the following claims.

What is claimed is:

1. A signal processing system capable of compensating for the channel response characteristics of an input waveform, comprising:

input means for inputting input specifications for specifying the design of a filter, including:

channel response characteristics defining the response characteristics of a channel used to acquire said input waveform; and user specifications for specifying a desired frequency response and a degree of compliance to the desired frequency response;

a filter builder for generating coefficients for said filter and outputting final performance specifications, having:

a compensation filter generator for generating coefficients corresponding to a compensation response on the basis of the inverse of the channel response characteristics; and a response filter generator for generating coefficients corresponding to a combination of an ideal response and a noise reduction response on the basis of the user specifications; and said filter for filtering said input waveform and outputting an overall response waveform having said desired frequency response, comprising:

a filter coefficient cache for storing the coefficients generated by said filter builder;

a compensation filter portion for filtering said input waveform using the coefficients stored in said filter coefficient cache corresponding to said compensation response; and a response filter portion having a response filter stage and a noise reduction stage for filtering the compensated waveform output from said compensation filter portion and outputting said overall response waveform; said response filter portion filtering using the coefficients stored in said filter coefficient cache corresponding to said combination of said ideal response and said noise reduction response.

2. The signal processing system according to claim 1, wherein said filter is implemented as *an* infinite impulse response (IIR) filter.

3. The signal processing system according to claim 1, wherein said filter is implemented as a finite impulse response (FIR) filter.

4. The signal processing system according to claim 1, wherein said channel response characteristics are predetermined based on a reference signal and the reference signal as acquired by said channel.

5. The signal processing system according to claim 1, wherein said user specifications comprise a bandwidth, a response optimization, a compensation compliance, [and] *or* a filter implementation type.

6. The signal processing system according to claim 5, wherein said response optimization is a pulse response optimization implemented using a Besselworth filter.

7. The signal processing system according to claim 5, wherein said response optimization is a noise performance optimization implemented using a Butterworth filter.

8. The signal processing system according to claim 5, wherein said response optimization is a flatness optimization implemented using a Butterworth filter.

9. The signal processing system according to claim 5, wherein said filter implementation type is finite impulse response (FIR) or infinite impulse response (IIR).

10. The signal processing system according to claim 1, wherein said user specifications default to predetermined values.

11. A signal processing element for filtering an input digital waveform, comprising:

a filter builder for generating filter coefficients on the basis of a channel frequency response and a user response characteristics; said channel frequency response being determined on the basis of a response input and a correction input;

an infinite impulse response (IIR) filter having an IIR input for said input digital waveform and an IIR coefficient input connected to said filter builder; said IIR filter producing an IIR filtered waveform from the input digital waveform on the basis of the filter coefficients generated by said filter builder;

a finite impulse response (FIR) filter having an FIR input for said input digital waveform and a FIR coefficient input connected to said filter builder; said FIR filter producing a FIR filtered waveform from the input digital waveform on the basis of the filter coefficients generated by said filter builder; and an output selector switch for selecting either said FIR filtered waveform or said [FIR] *IIR* filtered waveform for output.

12. The signal processing element according to claim 11, wherein said filter builder detects changes in the sampling rate of said input digital waveform that require the filter coefficients to be generated.

13. The signal processing element according to claim 11, wherein said filter builder generates filter coefficients for said FIR filter or said IIR filter on the basis of said output selector switch.

14. The signal processing element according to claim 11, wherein said filter builder has channel, compensation, shaper, and noise reduction outputs for evaluating the performance of the filtering.

15. The signal processing element according to claim 11, wherein said response input is a known input response and said correction input is a measured input response as acquired by an input channel.

16. The signal processing element according to claim 11, wherein said user response characteristics are used to generate filter coefficients corresponding to an arbitrary response portion of the filter.

17. The signal processing element according to claim 11, wherein said user response characteristics comprise a bandwidth, a response optimization, a compensation compliance, and a filter implementation type.

18. The signal processing element according to claim 17, wherein said response optimization is a pulse response optimization implemented using a Besselworth filter.

19. The signal processing element according to claim 17, wherein said response optimization is a noise performance optimization implemented using a Butterworth filter.

20. The signal processing element according to claim 17, wherein said response optimization is a flatness optimization implemented using a Butterworth filter.

21. The signal processing element according to claim 17, wherein said filter implementation type is FIR or IIR.

22. The signal processing element according to claim 11, wherein said user response characteristics default to predetermined values.

23. A method of filtering an input digital waveform to compensate for the response characteristics of an acquisition channel, comprising the steps of:

generating a compensation portion of a filter on the basis of an input channel response, using the steps of:

pre-warping said input channel response;

designing an analog filter emulating the pre-warped input channel response by making an initial filter guess and iterating the coefficients of said initial filter guess to minimize a mean-squared error;

inverting said analog filter; and digitizing the inverted analog filter to produce said compensation portion of said filter using a bilinear transformation; and filtering said input digital waveform using said compensation portion of said filter.

24. The method according to claim 23, further comprising the step of generating an arbitrary response portion of said filter on the basis of an input user specifications, wherein said input digital waveform is filtered using said arbitrary response portion of said filter, thereby producing a filter digital waveform having the desired response characteristics.

25. The method according to claim 24, wherein said input user specifications comprise a bandwidth, a response optimization, a compensation compliance, and a filter implementation type.

26. The method according to claim 24, wherein said arbitrary response portion of said filter comprises a shaper and a noise reducer.

27. The method according to claim 24, wherein said input user specifications default to predetermined values.

28. The method according to claim 23, wherein said filter is implemented as an infinite impulse response (IIR) filter.

29. The method according to claim 23, wherein said filter is implemented as a finite impulse response (FIR) filter.

30. The signal processing system according to claim 23, wherein said input channel response is predetermined based on a reference signal and the reference signal as acquired by said channel.

31. The method according to claim 23, wherein said filter type is FIR or IIR.

32. The method according to claim 23, wherein the coefficients of said initial filter guess are iterated until said mean-squared error is less than a compensation compliance specified in an input user specification[s].

*33. A method for filtering an input waveform, comprising the steps of:*

*determining a plurality of parameters for a digital filter to substantially flatten a frequency response of a channel of a digital oscilloscope across at least one frequency range based upon at least i) response characteristics of the channel and ii) a user input concerning a desired bandwidth;*

*building the digital filter according to the plurality of parameters;*

*receiving an input waveform on the channel;*

*converting the input waveform to a digital representation;*

*applying the digital filter to the digital representation; and*

*generating a filtered digital waveform,*

*wherein the channel has a nominal bandwidth and application of the digital filter yields an effective channel bandwidth substantially equal to the desired bandwidth.*

*34. The method of claim 33, wherein the parameters are further determined based upon a specified noise compensation on the channel.*

*35. The method of claim 33, wherein the digital filter improves a pulse response of the channel.*

*36. The method of claim 33, wherein the order of the digital filter is determined based on user input concerning at least one desired channel response characteristic.*

*37. The method of claim 33, wherein the order of the digital filter has a variable order.*

*38. The method of claim 33, wherein a frequency response of the digital filter comprises a substantial inverse of the channel response characteristics in a frequency range within the effective channel bandwidth.*

*39. The method of claim 33, further comprising changing the frequency scale of the channel frequency response.*

*40. The method of claim 33, wherein building the digital filter comprises converting a parameterized analog filter into a digital domain.*

*41. The method of claim 33, wherein determining the plurality of parameters comprises iteratively determining the parameters to minimize a mean-squared error between the channel frequency response and the filter frequency response.*

*42. The method of claim 33, wherein the digital filter comprises two or more cascaded digital filter elements.*

*43. The method of claim 33, wherein the digital filter comprises a Butterworth or Besselworth filter.*

*44. The method of claim 33, further comprising calibrating the channel without a probe coupled to the channel.*

*45. The method of claim 33, further comprising calibrating for the characteristics of a probe coupled to the channel according to parameters stored in non-volatile memory on the probe.*

*46. The method of claim 33, wherein determining the plurality of parameters comprises receiving user input through a graphical user interface.*

*47. The method of claim 33, wherein the digital oscilloscope comprises a digital sampling oscilloscope.*

*48. A method for filtering an input waveform, comprising the steps of:*

*determining a plurality of parameters for a digital filter to flatten a frequency response of a channel of a digital oscilloscope across at least one frequency range based upon response characteristics of the channel, said channel having a nominal bandwidth and a nominal pulse response;*

*building the digital filter according to the plurality of parameters, the digital filter being configured to flatten the channel frequency response and improve the pulse response of the channel;*

*receiving an input waveform on the channel;*

*converting the input waveform to a digital representation;*

*applying the digital filter to the digital representation; and*

*generating a filtered digital waveform,*

*wherein application of the digital filter substantially flattens the channel frequency response across the frequency range and substantially improves the channel pulse response.*

*49. The method of claim 48, wherein the parameters are further determined based upon a specified noise compensation on the channel.*

*50. The method of claim 48, wherein the parameters are determined according to a user input concerning a desired bandwidth for the channel.*

*51. The method of claim 50, wherein application of the digital filter yields an effective channel bandwidth substantially equal to the desired bandwidth.*

*52. The method of claim 48, wherein the order of the digital filter is determined based on at least one user specified response characteristic.*

*53. The method of claim 48, wherein the order of the digital filter is variable.*

*54. The method of claim 48, wherein a frequency response of the digital filter comprises a substantial inverse of the channel response characteristics in a frequency range within the effective channel bandwidth.*

*55. The method of claim 48, further comprising changing the frequency scale of the channel frequency response.*

*56. The method of claim 48, wherein building the digital filter comprises converting a parameterized analog filter into a digital domain.*

*57. The method of claim 48, wherein determining the plurality of parameters comprises iteratively determining the parameters to minimize a mean-squared error between the channel frequency response and the filter frequency response.*

*58. The method of claim 48, wherein the digital filter comprises two or more cascaded digital filter elements.*

*59. The method of claim 48, wherein the digital filter comprises a Butterworth or Besselworth filter.*

*60. The method of claim 48, further comprising calibrating the channel without a probe coupled to the channel.*

*61. The method of claim 48, further comprising calibrating for the characteristics of a probe coupled to the channel according to parameters stored in non-volatile memory on the probe.*

*62. The method of claim 48, wherein determining the plurality of parameters comprises receiving user input through a graphical user interface.*

*63. The method of claim 48, wherein the digital oscilloscope comprises a digital sampling oscilloscope.*

*64. A digital oscilloscope comprising:*

*a channel to receive an input waveform;*

*a converter to convert the input waveform to a digital representation; and*

*a digital filter to receive the digital representation, the digital filter having a frequency response to substantially flatten a frequency response of the channel across at least one frequency range based upon at least i) response characteristics of the channel and ii) a user input concerning a desired bandwidth;*

*wherein the channel has a nominal bandwidth and application of the digital filter yields an effective channel bandwidth substantially equal to the desired bandwidth.*

*65. The apparatus of claim 64 wherein the digital filter is built according to a plurality of parameters that are determined to substantially flatten the response of the channel across the at least one frequency range.*

*66. The apparatus of claim 65, wherein the parameters are further determined based upon a specified noise compensation specification.*

*67. The apparatus of claim 65, wherein the plurality of parameters are further determined iteratively by minimizing mean-squared error between the channel frequency response and the digital filter frequency response.*

*68. The apparatus of claim 64, wherein the digital filter improves pulse response of the channel.*

*69. The apparatus of claim 64, wherein the digital filter has an order determined based on user input concerning at least one desired channel response characteristic.*

*70. The apparatus of claim 64, wherein the digital filter has a variable order.*

*71. The apparatus of claim 64, wherein the frequency response of the digital filter comprises a substantial inverse of the channel response characteristics in a frequency range within the effective channel bandwidth.*

*72. The apparatus of claim 64, wherein the digital filter is built by converting a parameterized analog filter into a digital domain.*

*73. The apparatus of claim 64, wherein the digital filter comprises two or more cascaded digital filter elements.*

*74. The apparatus of claim 64, wherein the digital filter comprises a Butterworth or Besselworth filter.*

*75. The apparatus of claim 64, wherein the channel comprises a probe.*

*76. The apparatus of claim 75, wherein the probe contains parameter information to build the digital filter.*

*77. The apparatus of claim 64, further comprising a graphical user interface for user input of parameters for building the digital filter.*

*78. The apparatus of claim 64, wherein the digital filter comprises an infinite impulse response filter.*

*79. The apparatus of claim 64, wherein the digital filter comprises a finite impulse response filter.*

*80. The apparatus of claim 64, wherein the digital oscilloscope comprises a digital sampling oscilloscope.*

*81. A digital oscilloscope comprising:*

*a channel to receive an input waveform, the channel having a nominal bandwidth and a nominal pulse response;*

*a converter to convert the input waveform to a digital representation; and*

*a digital filter to receive the digital representation, the digital filter having a frequency response to substantially flatten a frequency response of the channel across at least one frequency range based upon response characteristics of the channel and to improve the pulse response of the channel;*

*wherein application of the digital filter yields i) an improved pulse response of the channel and ii) a substantially flattened frequency response of the channel across the at least one frequency range.*

*82. The apparatus of claim 81, wherein the digital filter is built according to a plurality of parameters that are determined to substantially flatten the response of the channel across the at least one frequency range.*

*83. The apparatus of claim 82, wherein the parameters are further determined based upon a specified noise compensation on the channel.*

*84. The apparatus of claim 82, wherein the parameters are determined according to a user input concerning a desired bandwidth.*

*85. The apparatus of claim 84, wherein application of the digital filter yields an effective channel bandwidth substantially equal to the desired bandwidth.*

*86. The apparatus of claim 84, wherein a frequency response of the digital filter comprises a substantial inverse of the channel response characteristics in a frequency range within the effective channel bandwidth.*

*87. The apparatus of claim 82, wherein the parameters are further determined based upon a specified noise compensation on the channel and according to a user input concerning a desired bandwidth.*

*88. The apparatus of claim 81, further comprising a graphical user interface for user input of parameters for building the digital filter.*

*89. The apparatus of claim 81, wherein the digital filter comprises an infinite impulse response filter.*

*90. The apparatus of claim 81, wherein the digital filter comprises a finite impulse response filter.*

*91. The apparatus of claim 81, wherein the digital oscilloscope comprises a digital sampling oscilloscope.*

* * * * *